(12) United States Patent
Murabayashi et al.

(10) Patent No.: US 6,424,547 B2
(45) Date of Patent: Jul. 23, 2002

(54) POWER SUPPLY MODULE UTILIZING EXPANSION POWER SUPPLY UNITS TO INCREASE POWER SUPPLY CAPACITY

(75) Inventors: Haruyasu Murabayashi; Takashi Horie; Masashi Isozumi; Yasuhiro Tsubota; Tsunetoshi Ooba; Hideki Kobori; Takatoshi Ootomo; Katsuya Marumo, all of Kyoto (JP); Theo Brusse, Hoofddorp (NL); Mike Irvin, London (GB)

(73) Assignee: Omron Corporation, Kyoto (JP)

( * ) Notice: Subject to any disclaimer, the term of this patent is extended or adjusted under 35 U.S.C. 154(b) by 0 days.

(21) Appl. No.: 09/865,512

(22) Filed: May 29, 2001

(30) Foreign Application Priority Data

| May 29, 2000 | (JP) | 2000-158617 |
| Oct. 4, 2000 | (JP) | 2000-304602 |
| Jan. 31, 2001 | (JP) | 2001-023489 |
| Jan. 31, 2001 | (JP) | 2001-023490 |

(51) Int. Cl.$^7$ ................................. H02M 7/00
(52) U.S. Cl. ............................ 363/69; 363/65
(58) Field of Search ..................... 363/65, 69, 67, 363/70

(56) References Cited

U.S. PATENT DOCUMENTS 6,014,322 A * 1/2000 Higashi et al. ............... 363/65
6,046,921 A * 4/2000 Tracewell

* cited by examiner

*Primary Examiner*—Bao Vu
(74) *Attorney, Agent, or Firm*—Foley & Lardner

(57) ABSTRACT

A power supply module includes a plurality of power supply modules. One of the power supply units is designated as a master power supply unit. Other power supply units are handled as expansion power supply units. The power supply modules can be connected in parallel on a DIN rail so that the master power supply unit may supply an external AC voltage to the expansion power supply units. When a desired power supply capacity exceeds a power supply capacity of the master power supply unit, an expansion power supply unit is connected in parallel with the master power supply unit in order to increase the power supply capacity.

25 Claims, 21 Drawing Sheets

F I G. 11
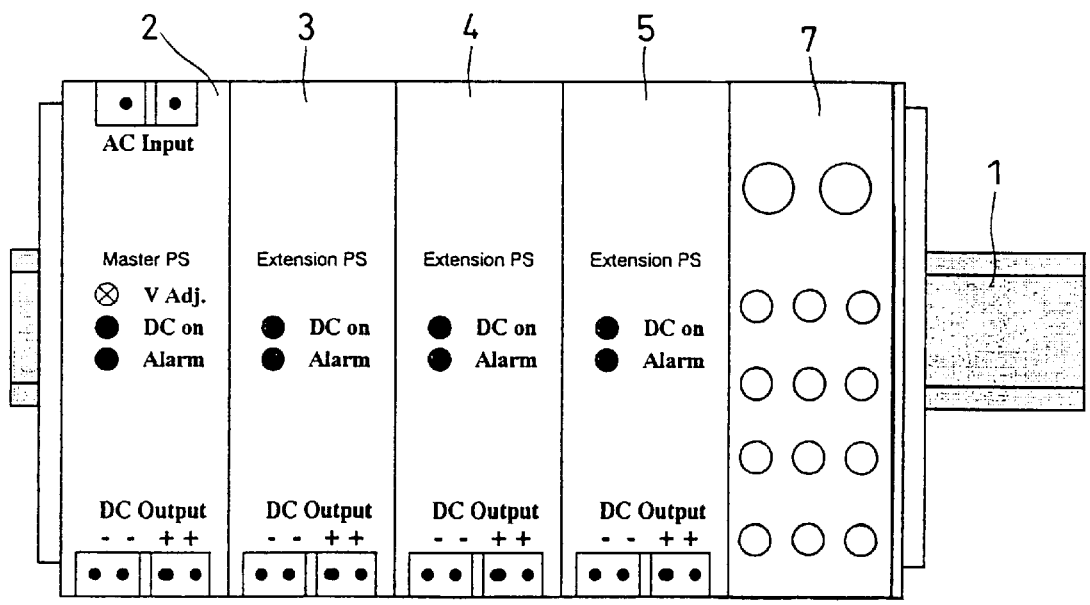
F I G. 12
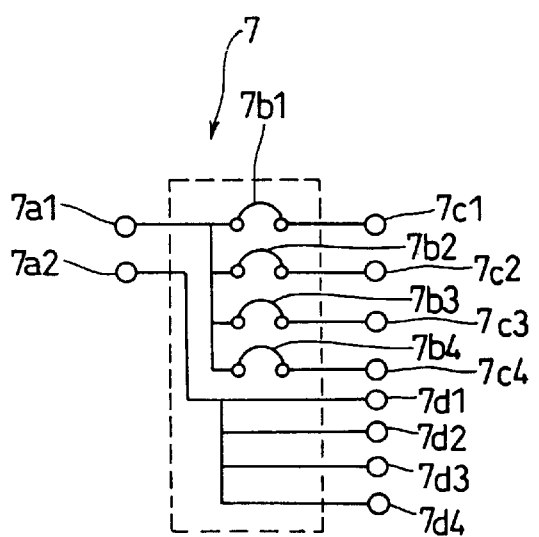

F I G. 20
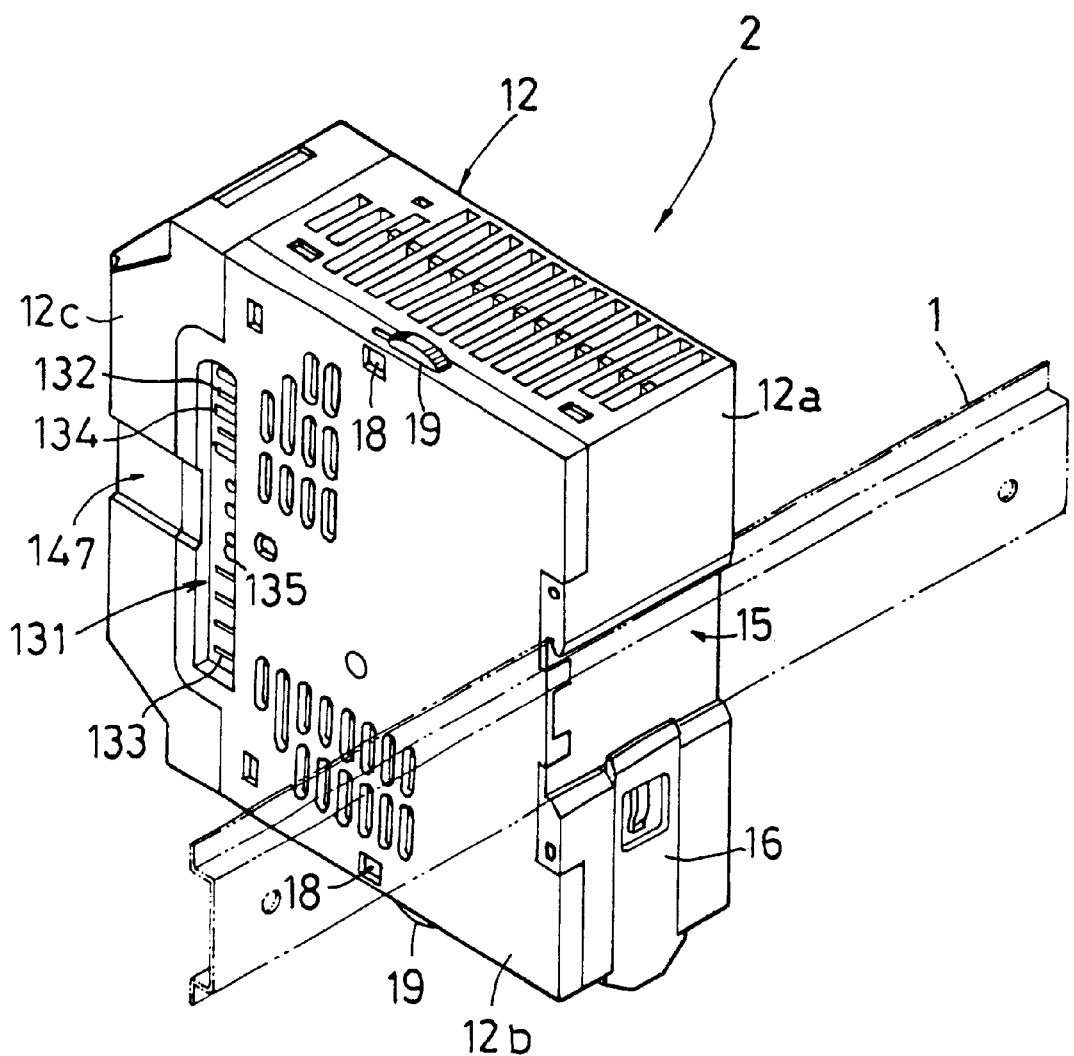

F I G . 22
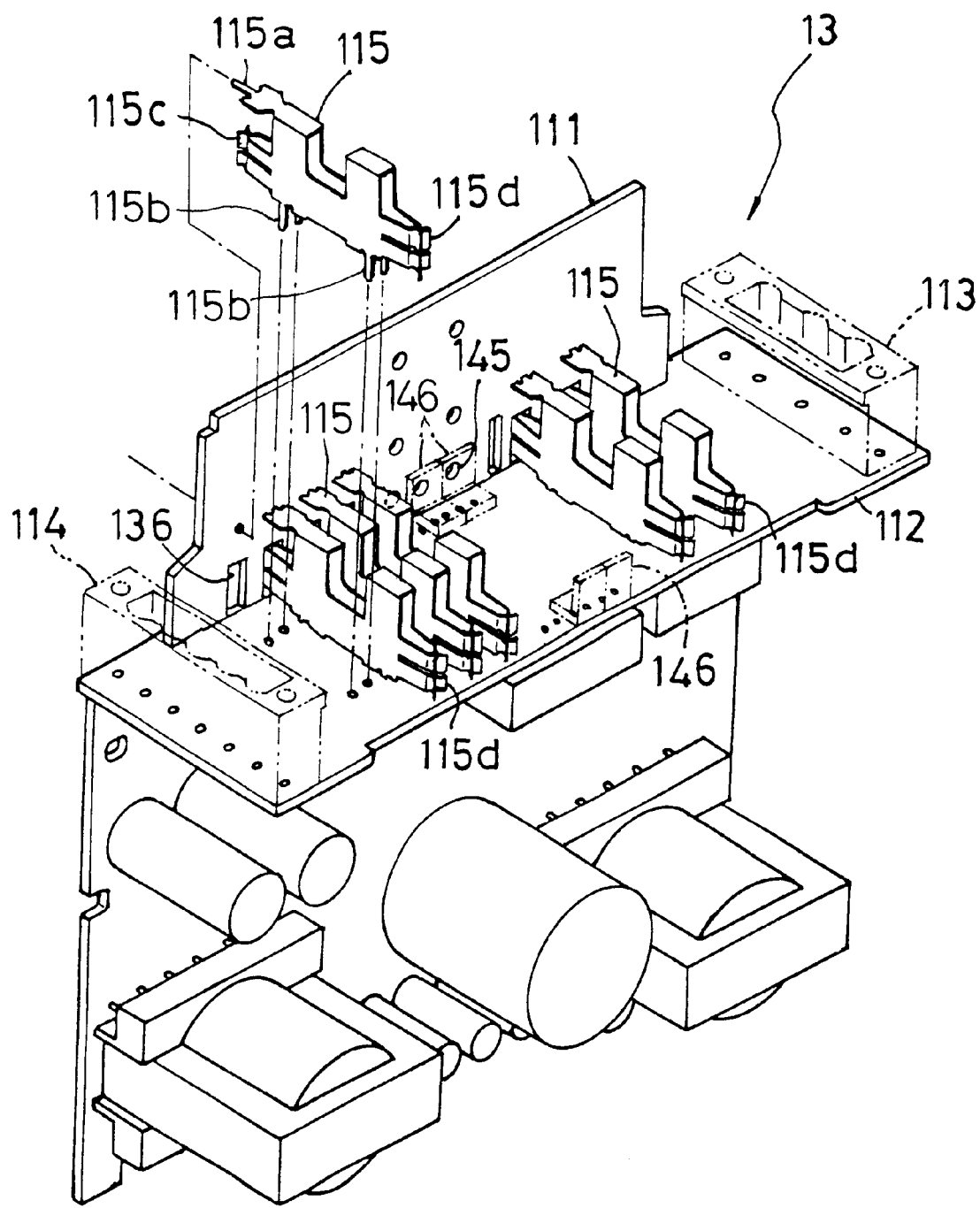

F I G . 25
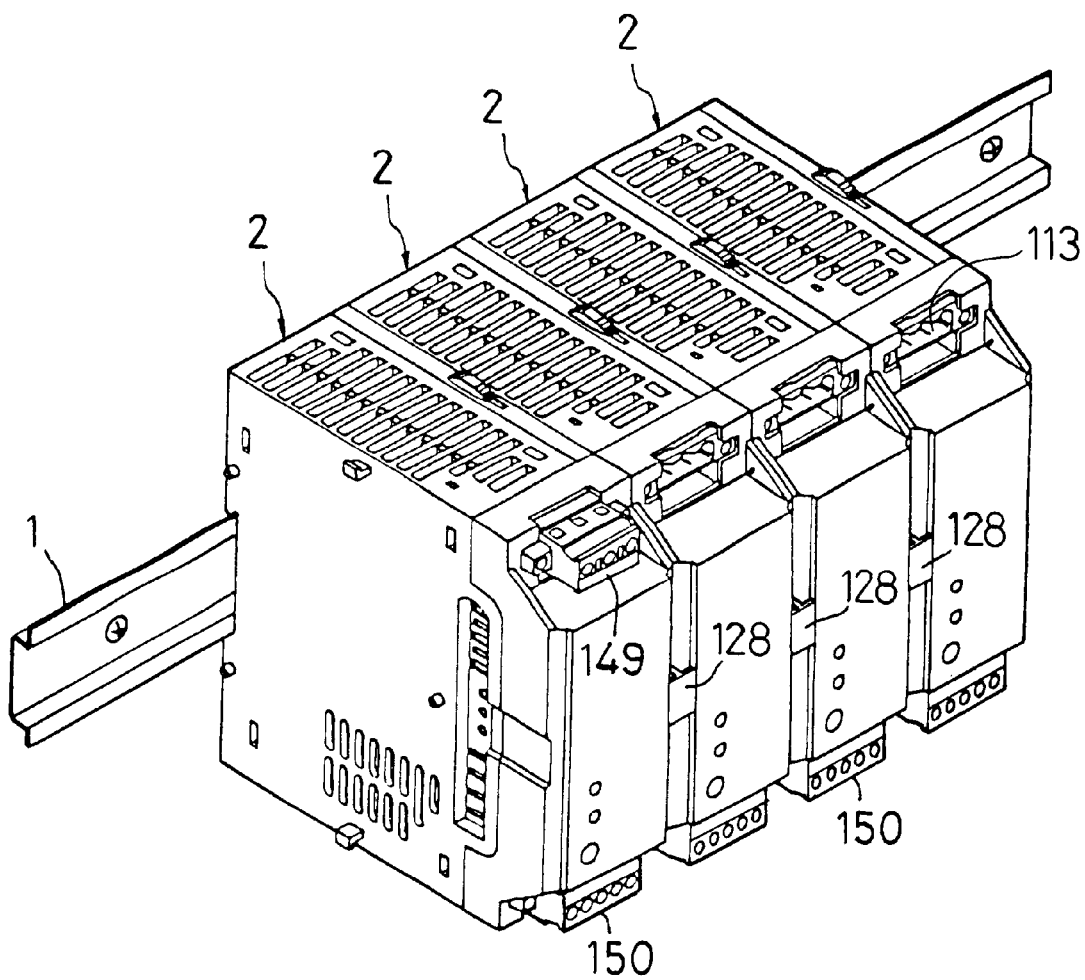

F I G. 30
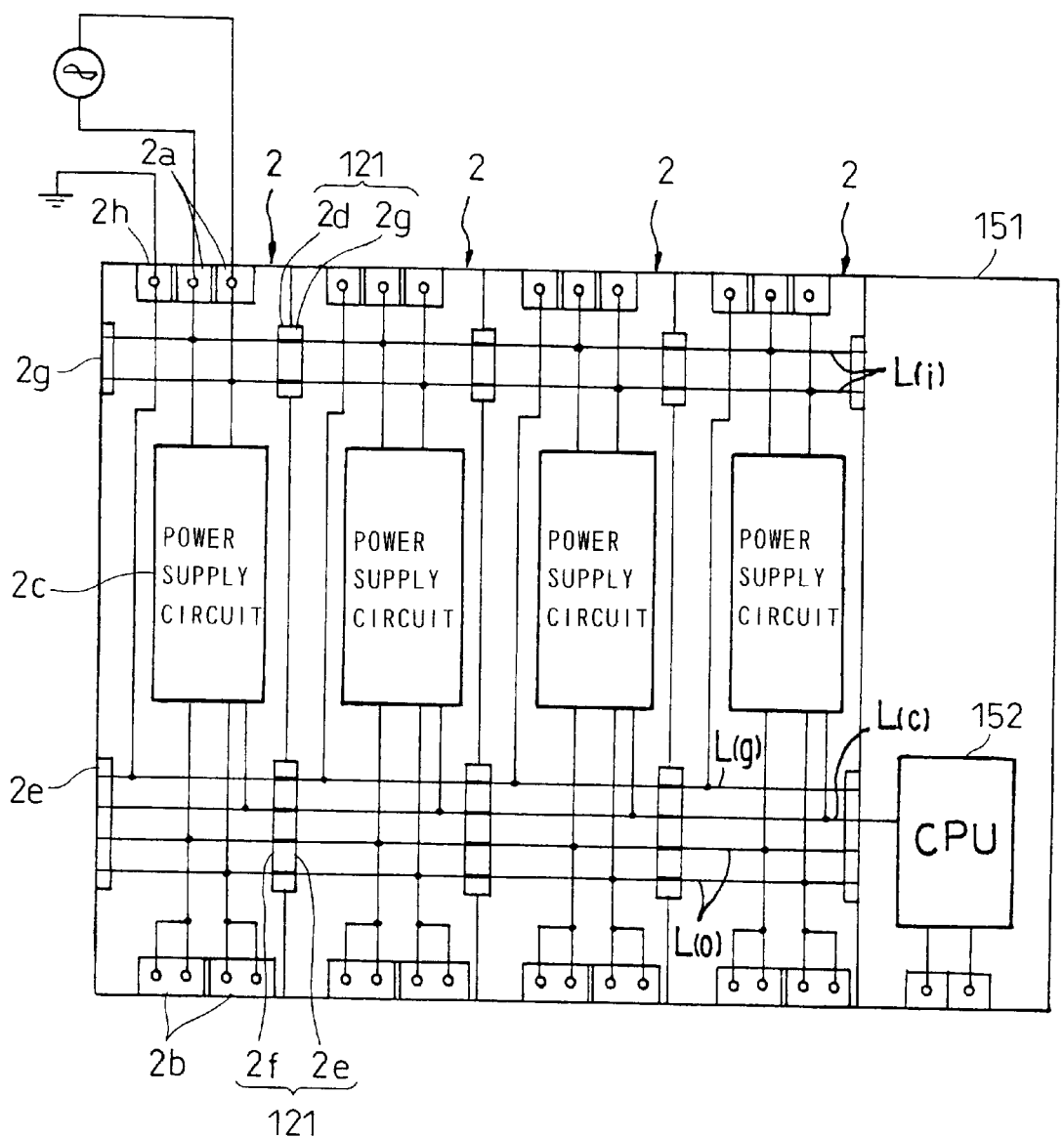

POWER SUPPLY MODULE UTILIZING EXPANSION POWER SUPPLY UNITS TO INCREASE POWER SUPPLY CAPACITY

BACKGROUND OF THE INVENTION

The present invention relates to a power supply module and a power supply unit using such a power supply module.

DESCRIPTION OF THE RELATED ART

As for various switching power supplies used for various machine facilities and the like in factories and plants, switching power supplies which have the same output voltage but are different in output W, such as switching power supplies for 15 W, 30 W, 50 W and 100 W, which are different in output W, i.e., power supply capacity, are manufactured and sold at requests, in use, of power supply users.

In the case of switching power supplies having different power supply capacities, however, the size of the casing, arrangement of a circuit board in the casing, the size and arrangement of a transformer and the like differ depending upon the power supply capacity even if the output voltage is the same.

Therefore, power supply manufactures need to newly conduct development and design for every switching power supply which differs in power supply capacity. Since development costs are necessary for every switching power supply which differs in power supply capacity, the sales prices of power supplies are affected.

Furthermore, as for the user as well, when there has occurred the need to use a switching power supply having a power supply capacity different from that used until then according to a load to be used, the user needs to newly purchase a switching power supply having the power supply capacity. Thereupon, the number of switching power supplies to be used increases, and the purchase costs increase.

SUMMARY OF THE INVENTION

Therefore, a main object of the present invention is to provide such a power supply module that its power supply capacity can be arbitrarily set by combining a plurality of power supply units.

Another object of the present invention is to provide such a power supply module that it can be used as a power supply having an arbitrary power supply capacity and its power supply manufacturer needs to conduct development design of substantially one power supply unit.

Still another object of the present invention is to provide such a power supply module that its user can set a power supply having a power supply capacity depending upon a load to be used and the necessity for the user to individually purchase power supplies of different capacities can be eliminated.

Other and further objects, features and advantages of the present invention will become apparent from the description below.

In accordance with the present invention, a power supply module includes: a first power supply unit for converting an external AC voltage inputted thereto to a DC voltage, outputting the DC voltage, and supplying the external AC voltage to other power supply units; and one or a plurality of second power supply units for converting an external AC voltage inputted thereto to a DC voltage and outputting the DC voltage, the second power supply units being connected in parallel with the first power supply unit, and an arbitrary power supply capacity is obtained by setting a number of the second power supply units connected in parallel with the first power supply unit.

In accordance with the present invention, preferably both the first power supply unit and the second power supply units can be attached to a DIN rail, and when expanding a power supply capacity, the second power supply unit is attached to the DIN rail and connected in parallel with the first power supply unit.

In accordance with the present invention, preferably the first and second power supply units have an identical power supply capacity.

BRIEF DESCRIPTION OF THE DRAWINGS

These and other objects as well as advantages of the invention will become clear by the following description of preferred embodiments of the invention with reference to the accompanying drawings, wherein:

FIG. 11 is a front view of a power supply module according to a fifth preferred embodiment of the present invention;

FIG. 12 is a circuit diagram of a terminal box in a power supply module of FIG. 11;

FIG. 20 is a perspective view of a power supply unit of FIG. 18 seen from the rear side;

FIG. 22 is an enlarged perspective view of a circuit board in a power supply unit of FIG. 21;

FIG. 25 is a perspective view of a power supply module of FIG. 23;

FIG. 30 is an electric circuit diagram of a power supply module according to a thirteenth preferred embodiment of the present invention;

In all these figures, like components are indicated by the same numerals.

DETAILED DESCRIPTION OF THE PREFERRED EMBODIMENTS

Figure 1:
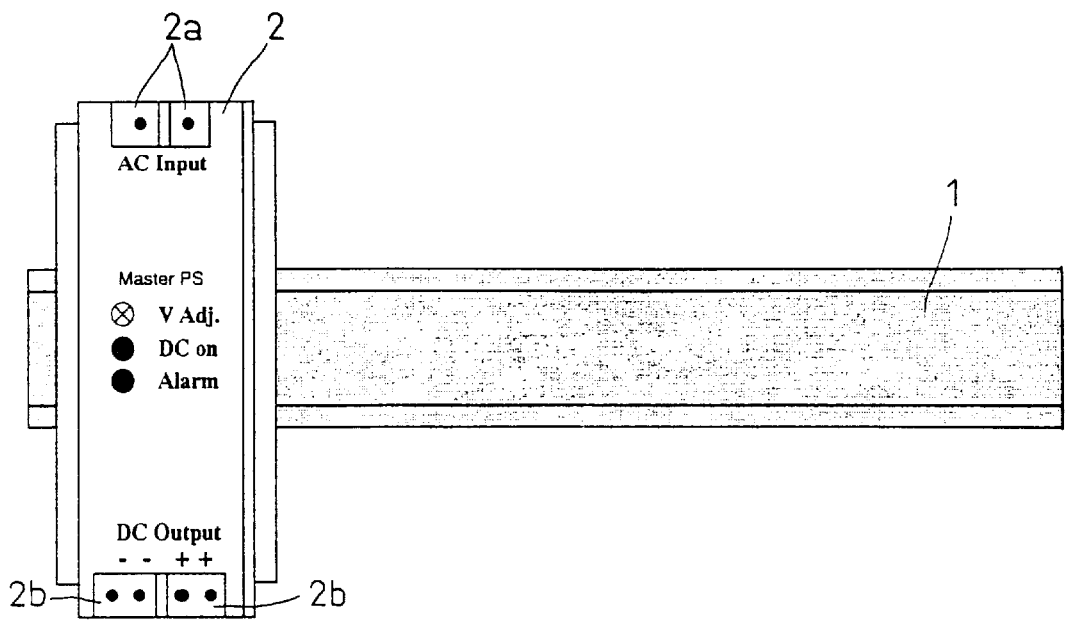
FIG. 1 is a front view of a master power supply unit attached to a DIN rail in a power supply module according to a first preferred embodiment of the present invention.
Figure 2:
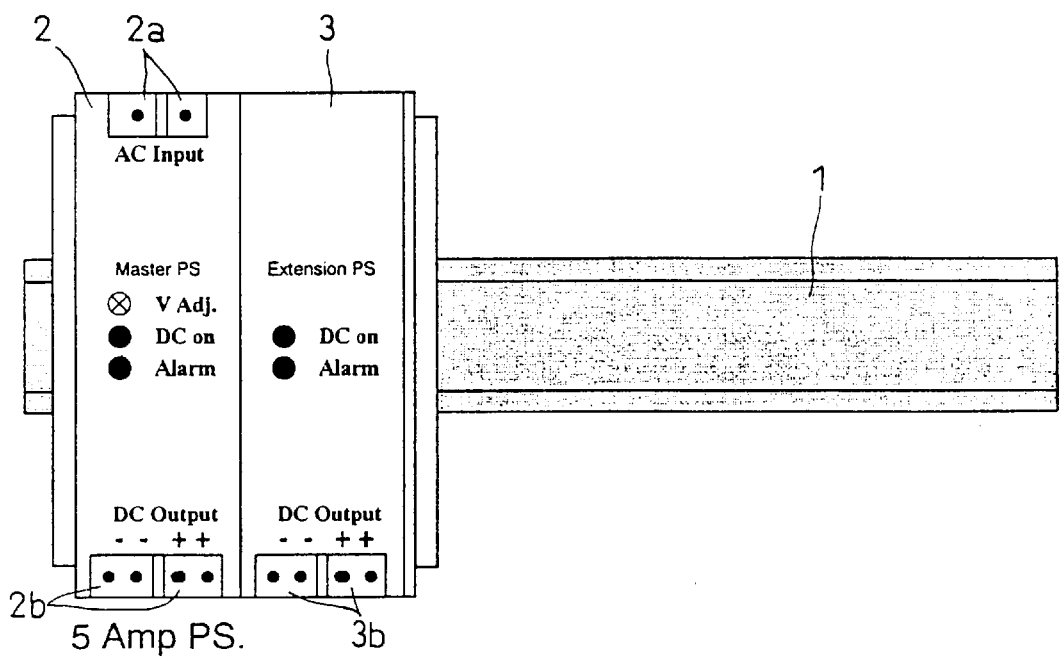
FIG. 2 is a front view of a master power supply unit attached to a DIN rail as shown in FIG. 1 and one expansion power supply unit connected to the master power supply unit.
Figure 3:
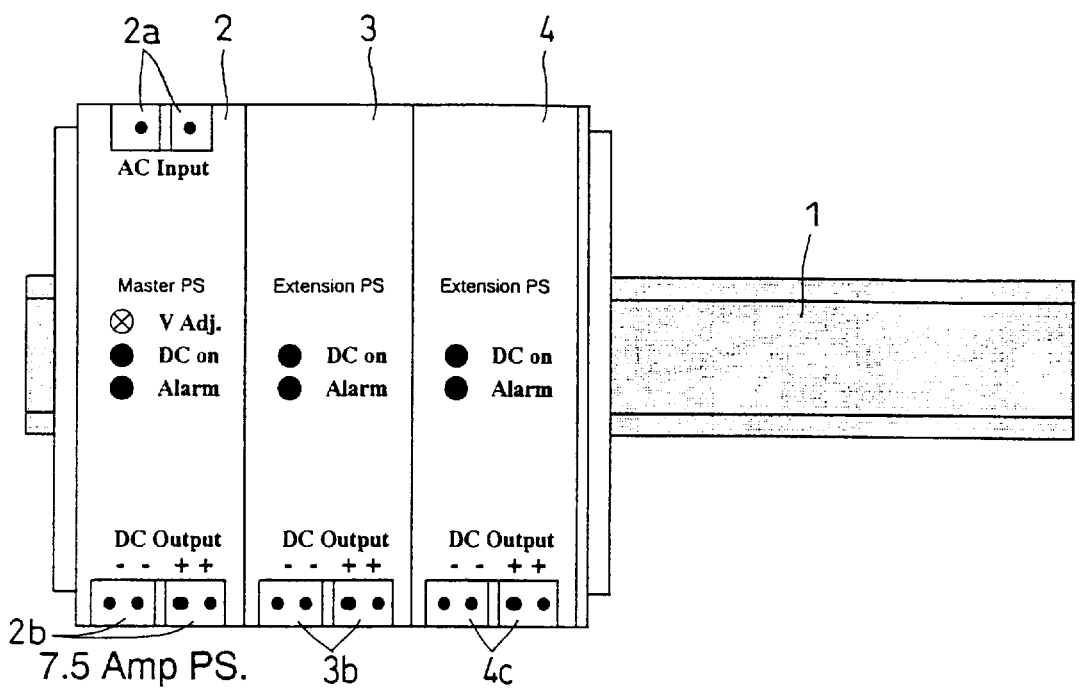
FIG. 3 is a front view of a master power supply unit attached to a DIN rail as shown in FIG. 1 and two expansion power supply units connected to the master power supply unit.
Figure 4:
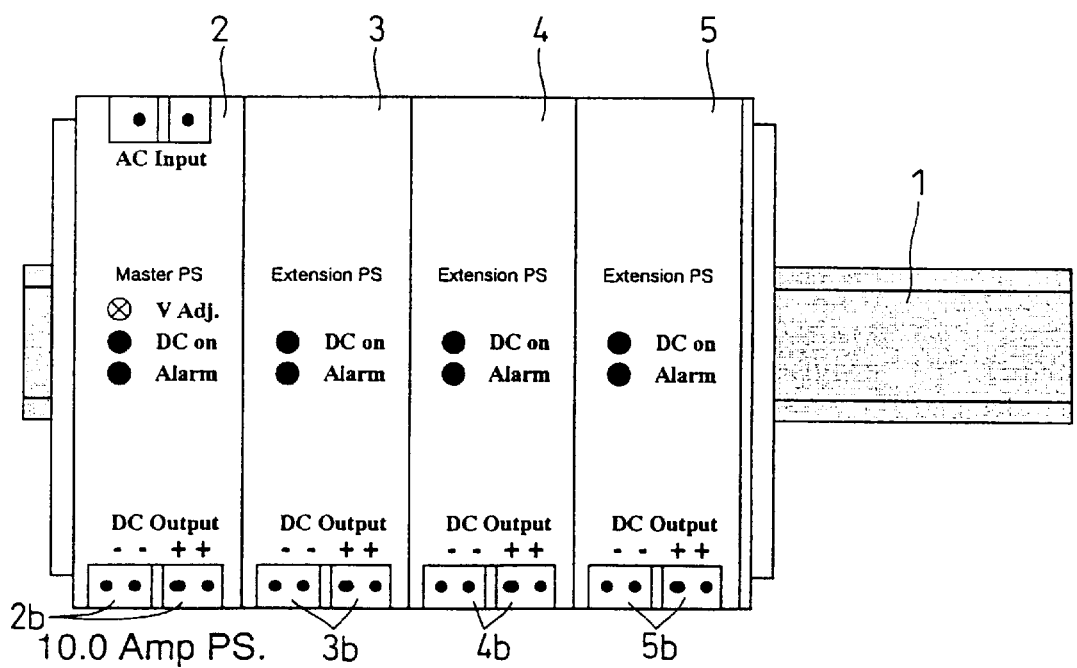
FIG. 4 is a front view of a master power supply unit attached to a DIN rail as shown in FIG. 1 and three expansion power supply units connected to the master power supply unit.
Figure 5:
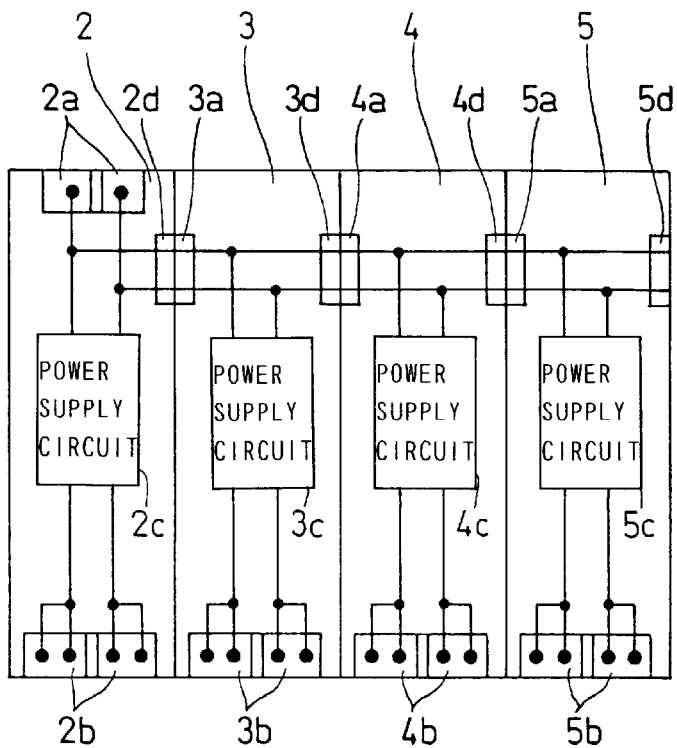
FIG. 5 is an electric circuit diagram of a power supply module in a state of FIG. 4.

Hereinafter, details of the present invention will be described by referring to embodiments shown in the drawing.

A power supply module according to a first preferred embodiment of the present invention will now be described by referring to FIGS. 1 to 5.

As one example of a combination of power supply units, each of power supply modules shown in FIGS. 1 to 5 has a combination of a plurality of power supply units 2 to 5 having the same output voltage and the same power supply capacity.

As a master power supply unit, a power supply unit 2 is supplied with an external AC voltage. The power supply unit 2 converts the external AC voltage to a DC voltage, and outputs the DC voltage. On the other hand, the power supply unit 2 supplies the external AC voltage to other power supply units.

Power supply units 3 to 5 are connected in parallel with the master power supply unit 2 as expansion power supply units. The power supply units 3 to 5 are supplied with the external AC voltage from the master power supply unit 2, and each of the power supply units 3 to 5 converts the supplied external AC voltage to a DC voltage and outputs the DC voltage.

The power supply module can have an arbitrary power supply capacity by setting the number of parallel connections of the expansion power supply units 3 to 5 for the master power supply unit 2.

Both the master power supply unit 2 and the expansion power supply units 3 to 5 are attached to a DIN rail 1 serving as an attachment rail so as to be movable.

The master power supply unit 2 has a power supply capacity of 60 W. The master power supply unit 2 has a casing that is a lengthwise long rectangle in front panel shape. This casing incorporates necessary parts for power supply circuit.

On an upper part of the casing, the master power supply unit 2 has AC input terminals 2a supplied with an external commercial AC voltage of 100 to 240 VAC. On a bottom part of the casing, the master power supply unit 2 has DC output terminals 2b for outputting a DC output of 24 VDC and 2.5 A.

The master power supply unit 2 further has an AC output side connector 2d on a casing side face through which the expansion power supply unit 3 is connected in parallel. The master power supply unit 2 has a power supply circuit 2c connected to these terminals 2a, 2b and 2d therein.

The power supply circuit 2c converts the AC voltage inputted from the outside via the AC input terminals 2a to a stabilized output voltage of 24 VDC, and outputs the stabilized output voltage to the DC output terminals 2b. As an example, the power supply circuit 2c is a well known switching power supply of insulation type.

On a front panel of the master power supply unit 2, English characters are indicated. "Vadj" indicates that a variable resistor located on the left side thereof is to be used for output voltage adjustment. "DCon" indicates that the output voltage is being outputted by lighting of a lamp located on the left side thereof. "Alarm" indicates that the master power supply unit 2 is in an abnormal state by lighting of a lamp located on the left side thereof. The DC output terminals 2b have two plus side (+) terminals and two minus side (−) terminals. One plus side terminal and one minus side terminal form one pair. Thus two pairs of DC output terminals 2b are formed.

An expansion power supply unit 3 has an AC input side connector 3a on a casing side face serving as a parallel connection face for the master power supply unit 2. The expansion power supply unit 3 has DC output terminals 3b on a bottom part of the casing. The expansion power supply unit 3 has an AC output side connector 3d on a casing side face serving as a parallel connection face for another expansion power supply unit 3. The expansion power supply unit 3 has a power supply circuit 3c therein.

The expansion power supply unit 3 has nearly the same configuration as that of the master power supply unit 2. The expansion power supply unit 3 is a power supply unit for 100 to 240 VAC input and 24 VDC, 2.5 A and 60 W output. Unlike the master power supply unit 2, the expansion power supply unit 3 does not have AC input terminals 2a on an upper portion of its front panel. The expansion power supply unit 3 has DC output terminals 3b for outputting 24 VDC on a bottom portion of the front panel.

In the above described case, it is possible to use only master power supply units 2 as all power supply units and handle one of the master power supply units 2 as the master power supply unit and other master power supply units 2 as expansion power supply units. The power supply circuit 3c of the expansion power supply unit 3 is adapted to convert an AC voltage inputted from the master power supply unit 2 via the AC input side connector 3a to a stabilized DC output voltage, and output the stabilized DC output voltage to the outside via the DC output terminal 3b. There are various schemes of such a power supply circuit 3c. Since they are well known, detailed description thereof will be omitted.

In the same way as the master power supply unit 2, English characters are indicated on a front panel of the extension power supply unit 3. "DCon" indicates that the output voltage is being outputted by lighting of a lamp located on the left side thereof. "Alarm" indicates that the first extension power supply unit 3 is in an abnormal state by lighting of a lamp located on the left side thereof. Since the DC output terminals 3b of the expansion power supply unit 3 have the same configuration as that of the master power supply unit 2, description thereof will be omitted.

The AC input side connector 3a of the expansion power supply unit 3 is a connector electrically and mechanically connected to the AC output side connector 2d of the master power supply unit 2. The AC input side connector 3a of the expansion power supply unit 3 is electrically connected to the AC output side connector 2d of the master power supply unit 2. The AC voltage is supplied from the master power supply unit 2 to the AC input side connector 3a of the expansion power supply unit 3. Within the expansion power supply unit 3, the AC output side connector 3d is electrically connected to the AC input side connector 3a via appropriate wiring.

Other expansion power supply units 4 and 5 have AC input side connectors 4a and 5a on casing side faces serving as first parallel connection faces, respectively. The expansion power supply units 4 and 5 have DC output terminals 4b and 5b on bottom parts of the casings, respectively. The expansion power supply units 4 and 5 have power supply circuits 4c and 5c therein, respectively. The expansion power supply units 4 and 5 have AC output side connectors 4d and 5d on casing side faces serving as second parallel connection faces. The expansion power supply units 4 and 5 are switching power supplies having the same configuration as that of the expansion power supply unit 3. The expansion power supply units 4 and 5 are only provided with characters, and description thereof will be omitted.

Each of the expansion power supply units 4 and 5 has a front panel configuration similar to that of the expansion power supply unit 3. Therefore, the expansion power supply units 4 and 5 may be replaced by each other, or each of the expansion power supply units 4 and 5 may be replaced by the expansion power supply unit 3. The power supply units 2 to 5 are adapted to be able to output individual DC output voltages from the DC output terminals 2b to 5b, respectively.

In the power supply module of the first embodiment, the AC voltage inputted from the AC input terminal 2a of the master power supply unit 2 is supplied to each of the extension power supply units 3 to 5. As a result, DC voltages can be individually outputted from the DC output terminals 2b to 5b respectively of the power supply units 2 to 5.

Since each of the power supply units 2 to 5 is a power supply unit for 24 VDC and 2.5 A (60 W) output, each of the power supply units The expansion power supply units 3 to 5 in the above described power supply module do not have AC input terminals. As a result, the manufacturing cost of the power supply module can be reduced.

By the way, for the purpose of unit unification, the master power supply unit 2 may be used as an expansion power supply unit. In this case, the manufacturing cost can be further reduced because of wiring which becomes unnecessary.

Figure 6:
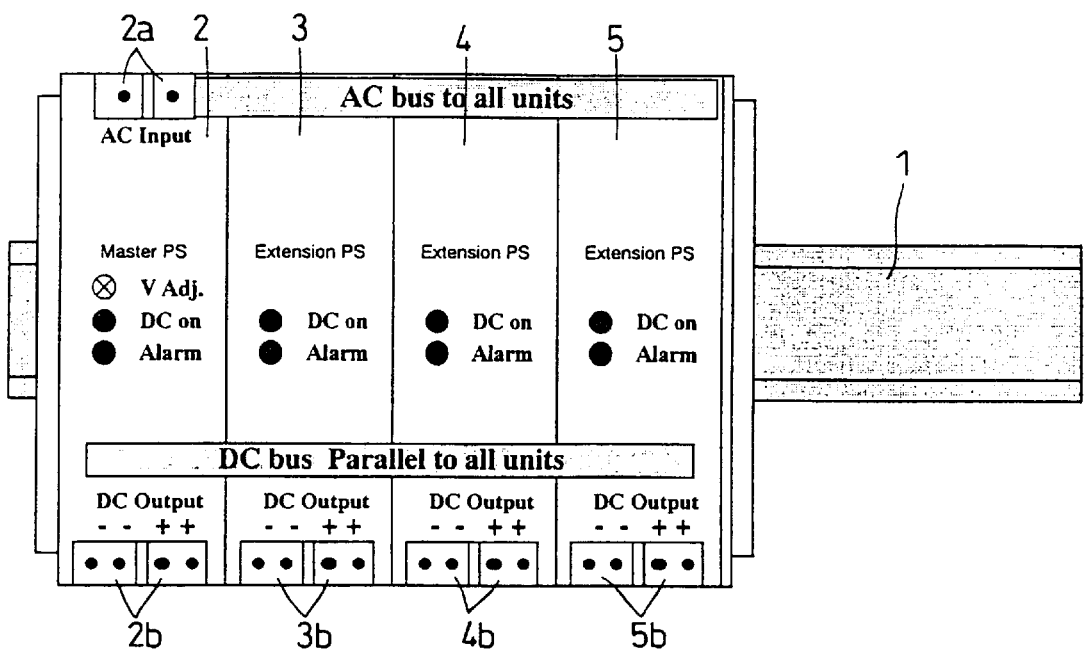
FIG. 6 is a front view of a power supply module according to a second preferred embodiment of the present invention.
Figure 7:
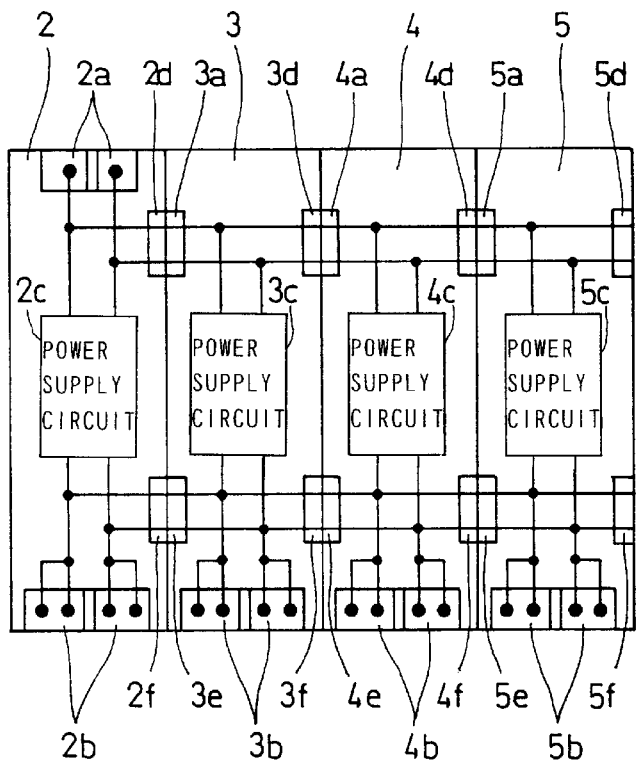
FIG. 7 is an electric circuit diagram of a power supply module of FIG. 6.

A power supply module according to a second embodiment of the present invention will now be described by referring to FIGS. 6 and 7. The DC output terminals 2b and 3b to 5b respectively of the master power supply unit 2 and the expansion power supply units 3 to 5 are connected in common. In the master power supply unit 2, a DC output side connector 2f is provided. In the expansion power supply units 3 to 5, DC input side connectors 3e to 5e and DC output side connectors 3f to 5f are provided.

Since each of the power supply units 2 to 5 is a power supply unit for 24 VDC and 2.5 A (60 W) output, each of the power supply units 2 to 5 becomes 24 V in output voltage and 10.0 A in output current.

In the case of the second embodiment, the power supply capacity of only the master power supply unit 2 is 24 V×2.5 A=60 W. In the case where this power supply capacity alone cannot cope with the load, the expansion power supply unit 3 is added for extension. As a result, the power supply capacity becomes 24 V×2.5 A×2=120 W. In the case where the power supply capacity is still insufficient, other expansion power supply units 4 and 5 are connected in parallel for extension to increase the power supply capacity.

According to this power supply module, the power supply manufacturer can provide users with power supplies of arbitrary capacities by, for example, manufacturing only power supply units having the same output voltage. Therefore, the power supply manufacturer need not develop power supplies of different capacities. By that amount, the development cost is reduced and the sales price can be reduced. Furthermore, the number of the power supply units having the same capacity also increases, and the sales price can be made lower, which is favorable to users. In this case, the sales price of two master power supply units is low for the user. In addition, as compared to the purchase of separate power supplies according to capacities, the user needs only to purchase one or more power supply units of the same capacity according to application, resulting in costing even less.

The power supply units 2 to 5 may output 24 VDC independently of each other, or may output 24 VDC individually. Selection of independence or individuality in this case may be conducted by, for example, operating a selection switch disposed on the front panel of the master power supply unit 2. The internal circuit configuration and mechanism in this case is not illustrated.

Figure 8:
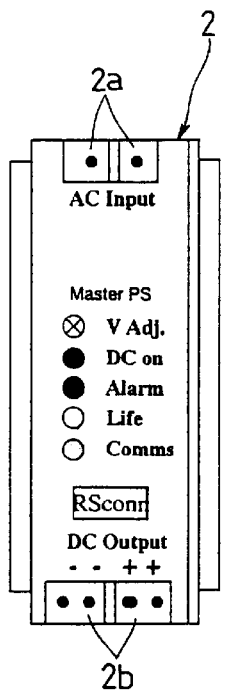
FIG. 8 is a front view of a master power supply unit in a power supply module according to a third preferred embodiment of the present invention.
Figure 9:
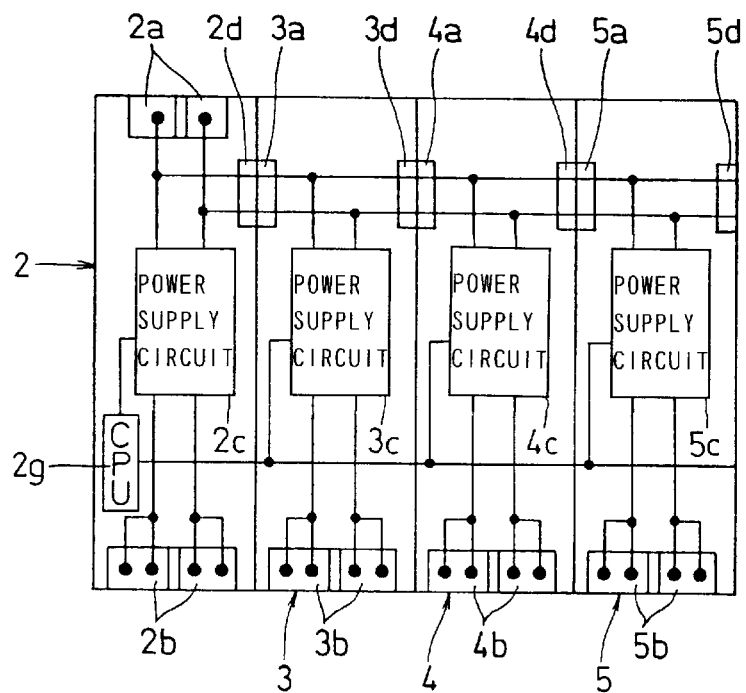
FIG. 9 is an electric circuit diagram of a power supply module using a master power supply unit of FIG. 8.

A power supply module according to a third embodiment of the present invention will now be described by referring to FIGS. 8 and 9. In this power supply module, an intelligent function on the front panel of the master power supply unit 2 is added. The life of the master power supply unit 2 mainly depends on the capacitance degradation of an aluminum electrolytic capacitor for power supply generation incorporated in a power supply circuit. In the case where there is incorporated a life prediction circuit for predicting the life of the aluminum electrolytic capacitor on the basis of its capacitance degradation, a life prediction lamp is disposed on the front panel. Such an intelligent function as to be able to predict the life on the basis of the lighting of the lamp is provided.

This power supply module includes a combination of a plurality of power supply units. The master power supply unit 2 incorporates a communication/control microcomputer (CPU) 2g, which conducts communication with the outside. By using the CPU 2g, the master power supply unit 2 can conduct communication of data such as the output power, output voltage, power supply efficiency, temperature and the like with a personal computer in a centralized management center disposed in a suitable place of a factory or the like.

By this communication, control of the power supply module and control of individual power supply units in the power supply module can be conducted. As this control, determination of the activation order of the power supply units and setting of activation time can be conducted. In this case, it becomes possible to monitor various operation situations, such as load factors and output voltages of the power supply units, via the communication. Such centralized management can be conducted by a programmable controller (PLC) or the like, besides the personal computer.

Figure 10:
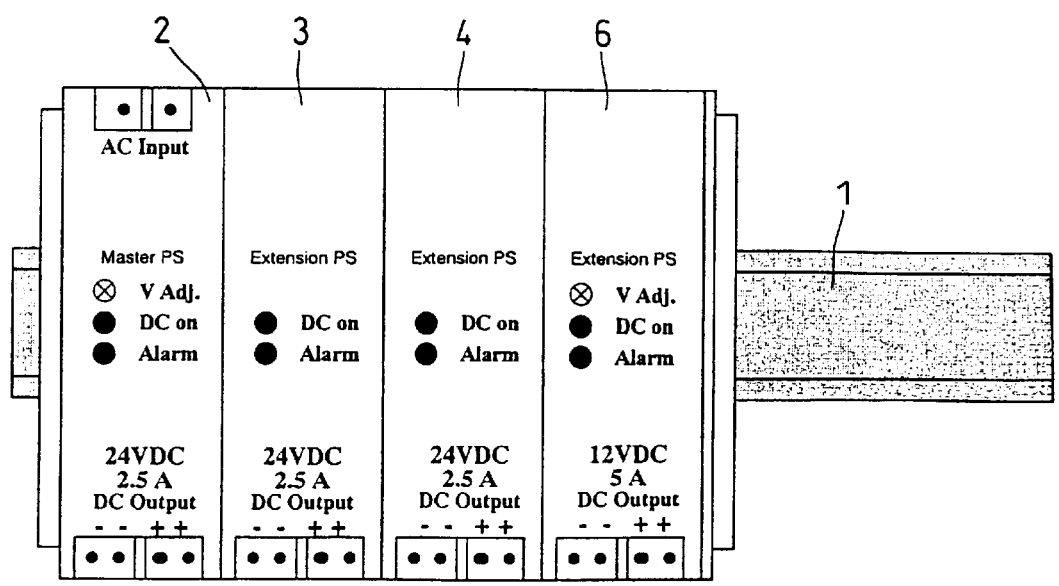
FIG. 10 is a front view of a power supply module according to a fourth preferred embodiment of the present invention.

A power supply module according to a fourth embodiment of the present invention will now be described by referring to FIG. 10. The master power supply unit 2 and the expansion power supply units 3 and 4 form a main power supply module. To the main power supply module, an expansion power supply unit 6 having an output voltage of, for example, 12 VDC and 5 A can be added for extension. By doing so, the power supply units 2 to 4 forming the main power supply module outputs 24 VDC. On the other hand, the expansion power supply unit 6 outputs 12 VDC. As a result, a multi-output type power supply can be provided. As a matter of course, a combination of one or a plurality of expansion power supply units having a different output voltage is possible.

A power supply module according to a fifth embodiment will now be described by referring to FIGS. 11 and 12. This power supply module has a terminal box (branch unit) 7 with fuse function. This branch unit 7 can be optionally added on the DIN rail 1, for extension of the main power supply module.

The branch unit 7 includes a pair of input terminals 7a1 and 7a2, to which an input voltage of 24 VDC is inputted from one of power supply units included in the main power supply module, fuses 7b1 to 7b4 serving as current limiting means connected in common to the first input terminal 7a1 at first end sides, output terminals 7c1 to 7c4 connected to second end sides of the fuses 7b1 to 7b4, and output terminals 7d1 to 7d4 connected in common to the second input terminals 7a2.

The branch unit 7 includes four pairs of output terminals respectively having output terminals 7c1 and 7d1, 7c2 and 7d2, 7c3 and 7d3, and 7c4 and 7d4. Between output terminals of each pair, a load, which is not illustrated, can be connected. Breakers, electronic means, or any other means, other than the fuses may be used as the current limiting means.

In the case where the power supply units included in the main power supply module has an overcurrent protection function, which stops output of the power supply when an overcurrent has been detected, the entire main power supply module is brought into the output stop state if a load connected to any one power supply unit becomes overloaded.

Even if a load connected between any one output terminal pair becomes overloaded and an overcurrent flows, a fuse corresponding to the load melts in the branch unit 7 in order to prevent influence on other loads. The above described output stop state is thus prevented.

Furthermore, supposing a configuration having an overall current of, for example, 16 A, occurrence of a shortcircuit on one load side might cause a possibility of 16 A or more at the maximum flowing through the load. In this embodiment, however, such an overcurrent can be prevented from flowing through the load. In the case where wiring corresponding to 4 A is used between each output terminal and the load, an overcurrent of 16 A due to load shortcircuit can be advantageously prevented from flowing.

In addition, if there is the branch unit 7, then the current from the input terminals can be branched to respective output terminals and supplied to loads. As a result, a power supply capable of supplying a large load current becomes unnecessary.

A sixth embodiment of the present invention will now be described by referring to FIG. 5 again. In the case where the user corresponds to a load of 7.5 A, it can be coped with by one master power supply unit 2 and the two expansion power supply units 3 and 4. In this case, the sixth embodiment is made possible to cope with up to 10 A by addition of the expansion power supply unit 5. If any power supply unit has failed, the expansion power supply unit 5 can be used as its reserve.

In the conventional technique, a power supply unit of 7.5 A is needed as a power supply unit for backing up a power supply unit corresponding to the load of 7.5 A. As the backup power supply unit, a similar power supply corresponding to 7.5 A is needed as the reserve, resulting in a cost disadvantage.

In the sixth embodiment, the three power supply, i.e., in this case, the master power supply unit 2 and the two expansion power supply units 3 and 4 each having 2.5 A, supply power to the load of 7.5 A as a power supply module corresponding to the load of 7.5 A. As the reserve, the third expansion power supply unit 5 of 2.5 A is sufficient. As a result, the purchase cost of reserve power supply unit can be remarkably reduced.

Figure 13:
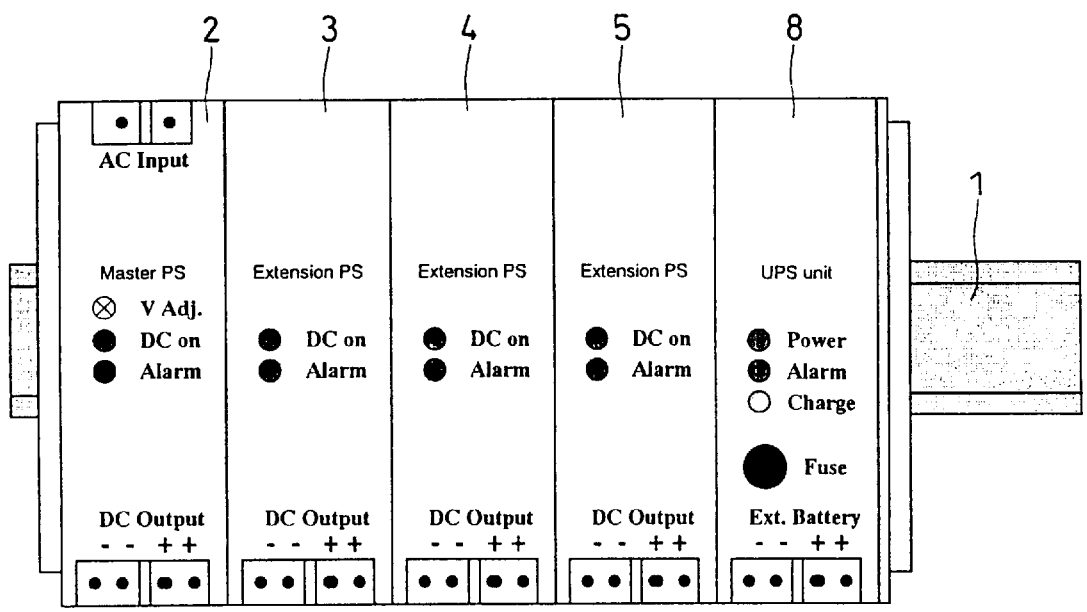
FIG. 13 is a front view of a power supply module according to a seventh preferred embodiment of the present invention.

A power supply module according to a seventh embodiment of the present invention will now be described by referring to FIG. 13. Uninterruptible power supply (UPS) unit 8 can be added for extension on the DIN rail 1. This UPS unit 8 incorporates a battery. At time of a power failure, the UPS unit 8 is adapted to be able to supply power. A charging function may be added to the UPS unit 8.

Figure 14:
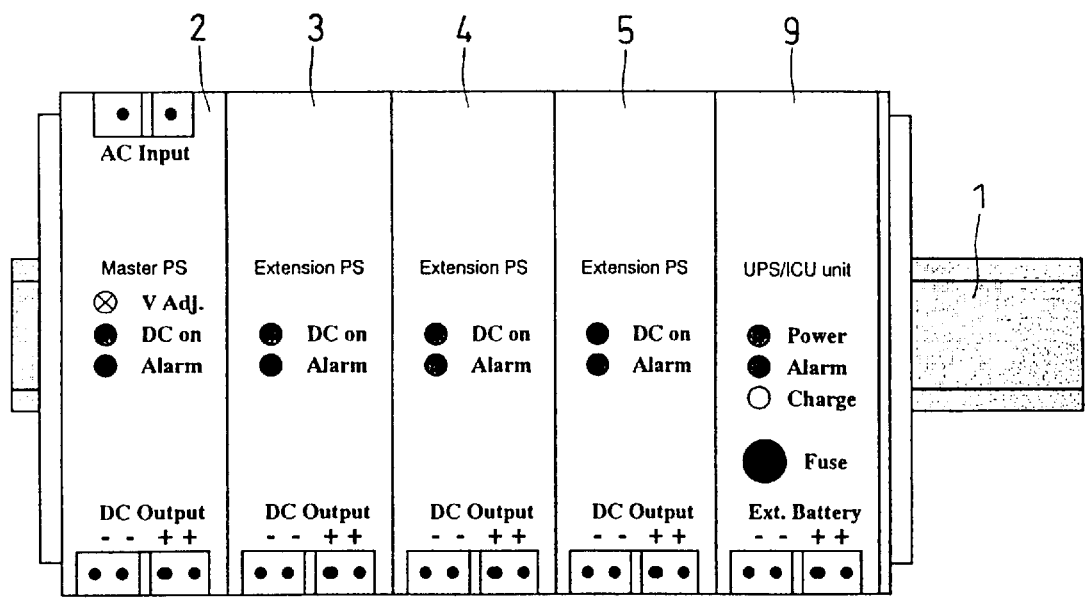
FIG. 14 is a front view of a power supply module according to an eighth preferred embodiment of the present invention.

A power supply module according to an eighth embodiment of the present invention will now be described by referring to FIG. 14. A UPS unit 9 corresponding to a peak load can be added for extension on the DIN rail 1.

There is a peak load in the load of a power supply. For example, in the load of a DC motor, a peak current flows sometimes. Since the UPS unit 9 can supply a current corresponding to the peak load, to the load, a power supply for peak load or a countermeasure such as an increase of the power supply capacity becomes unnecessary.

Figure 15:
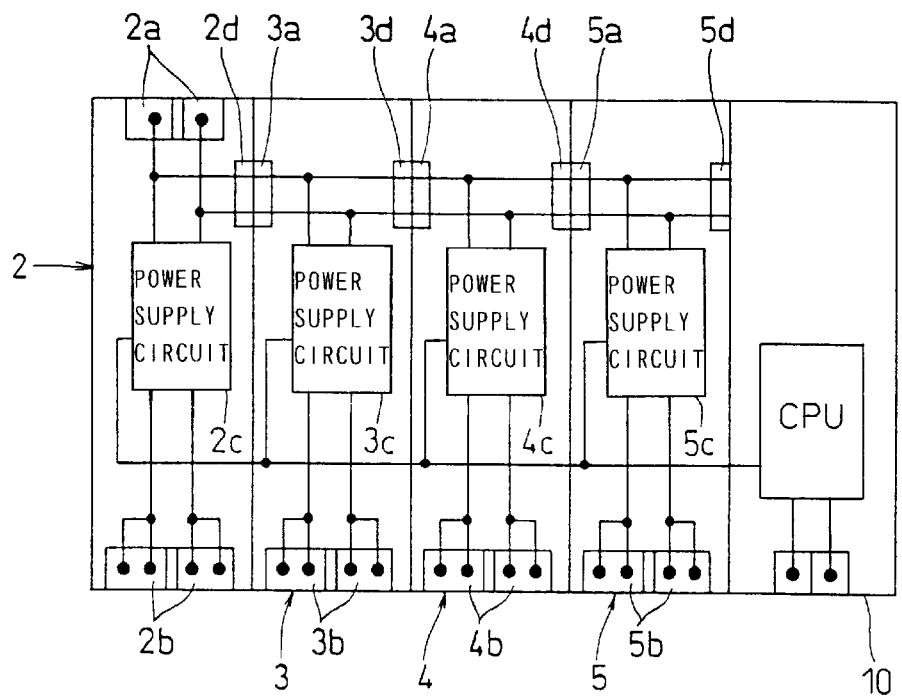
FIG. 15 is a front view of a power supply module according to a ninth preferred embodiment of the present invention.

A power supply module according to a ninth embodiment of the present invention will now be described by referring to FIG. 15. A communication unit 10 can be connected to the power supply unit 5. By using an internal microcomputer 11, the communication unit 10 conducts power supply control according to the content of communication conducted with the outside.

Figure 16:
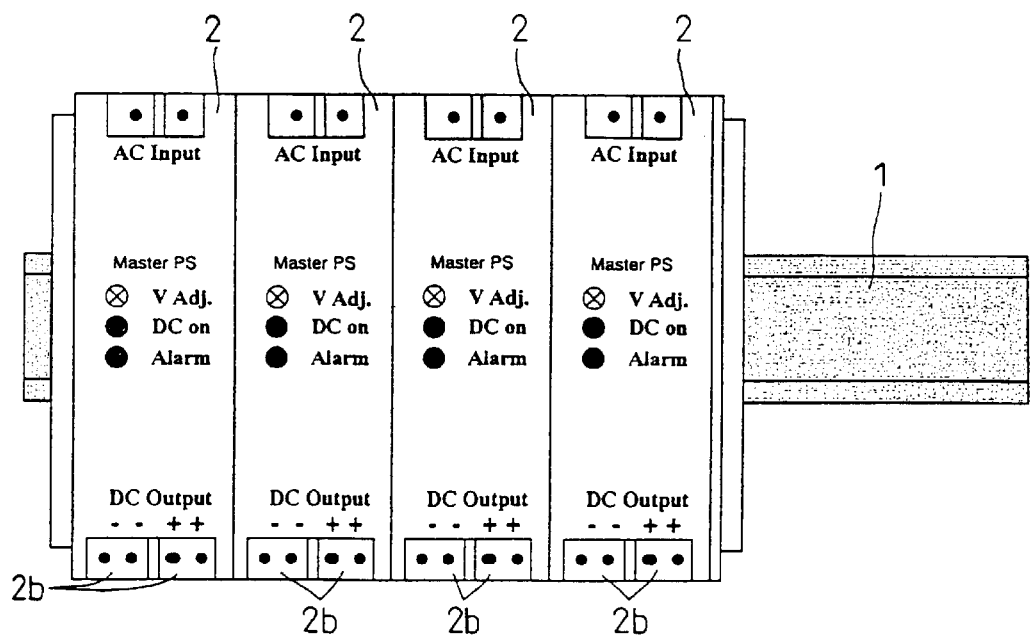
FIG. 16 is a front view of a power supply module according to a tenth preferred embodiment of the present invention.
Figure 17:
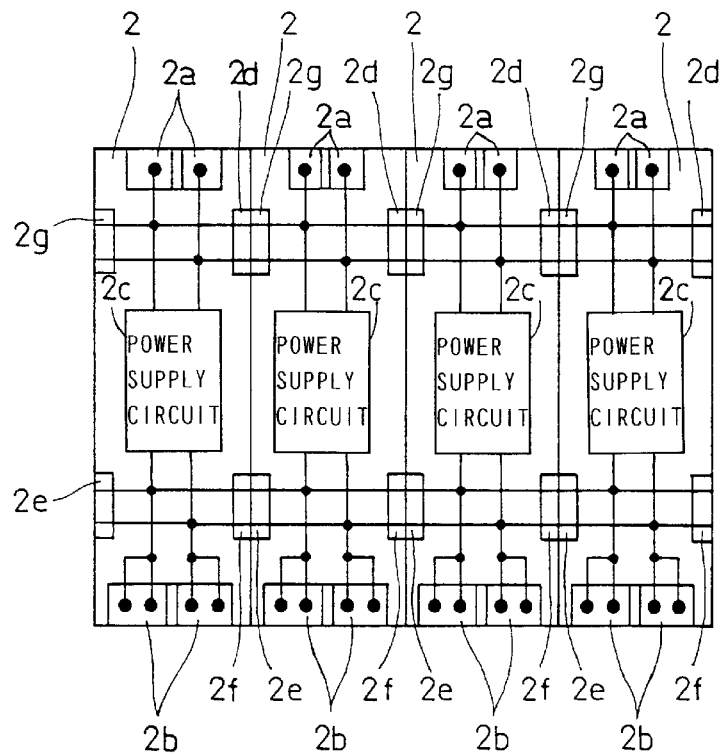
FIG. 17 is an electric circuit diagram of a power supply module of FIG. 16.

A power supply module according to a tenth embodiment of the present invention will now be described by referring to FIGS. 16 and 17. This power supply module includes power supply units 2 all having the same configuration. The power supply unit 2 includes an AC input terminal 2a, a DC output terminal 2b, a power supply circuit 2c, an AC output side connector 2d, an AC input side connector 2g, a DC input side connector 2e, and a DC output side connector 2f.

In the case of the tenth embodiment, every power supply unit has the AC input terminal 2a, and can become both the master power supply unit and the expansion power supply unit. As for the kinds of power supply units, only one kind suffices and the cost reduction becomes possible.

Figure 18:
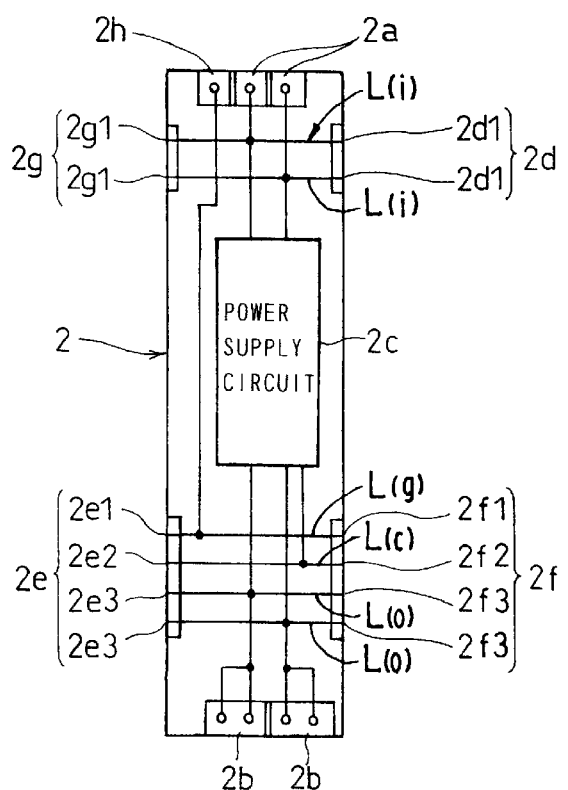
FIG. 18 is an electric circuit diagram of a power supply unit used in a power supply module according to an eleventh embodiment of the present invention.
Figure 19:
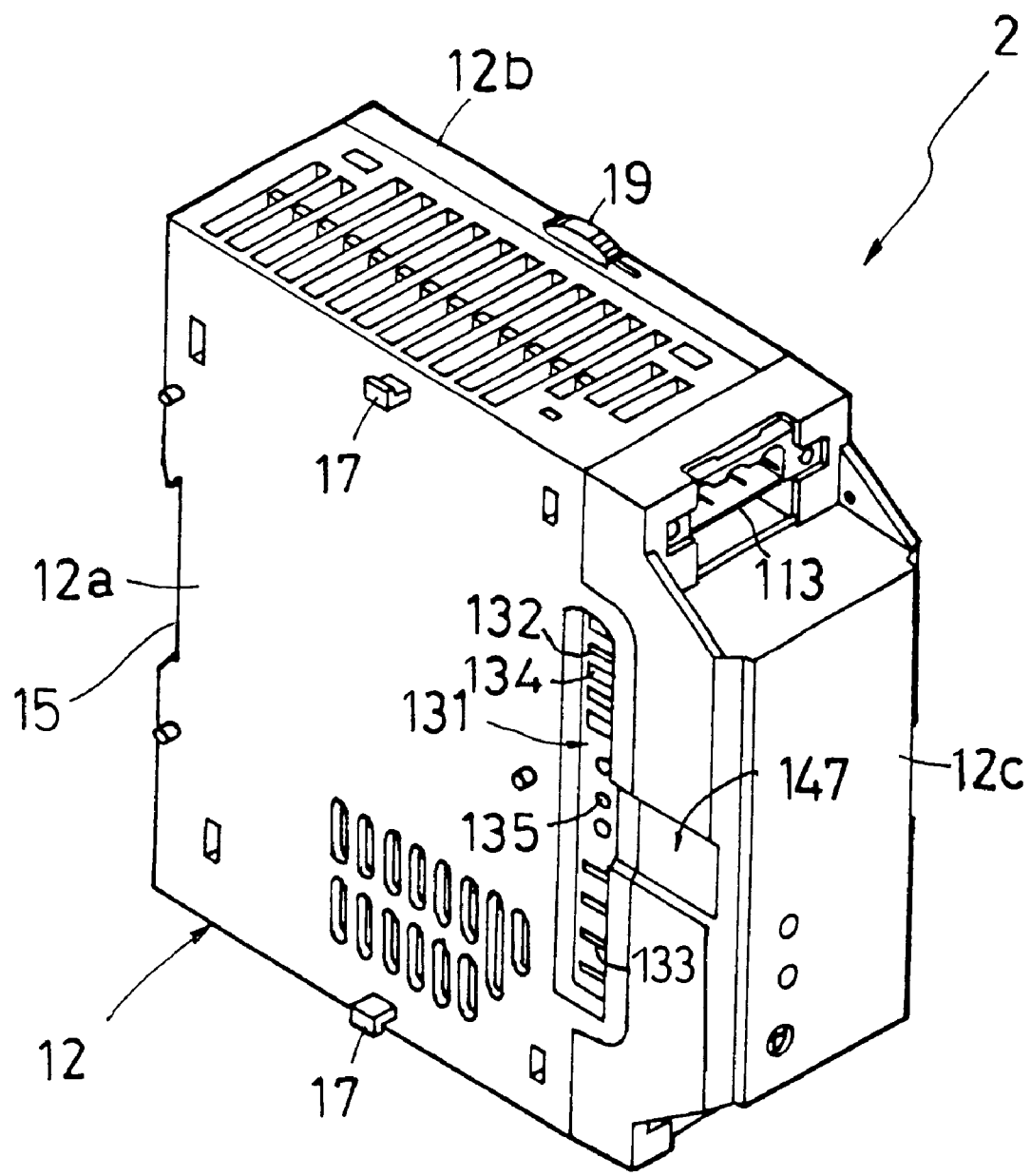
FIG. 19 is a perspective view of a power supply unit of FIG. 18 seen from the front side.
Figure 21:
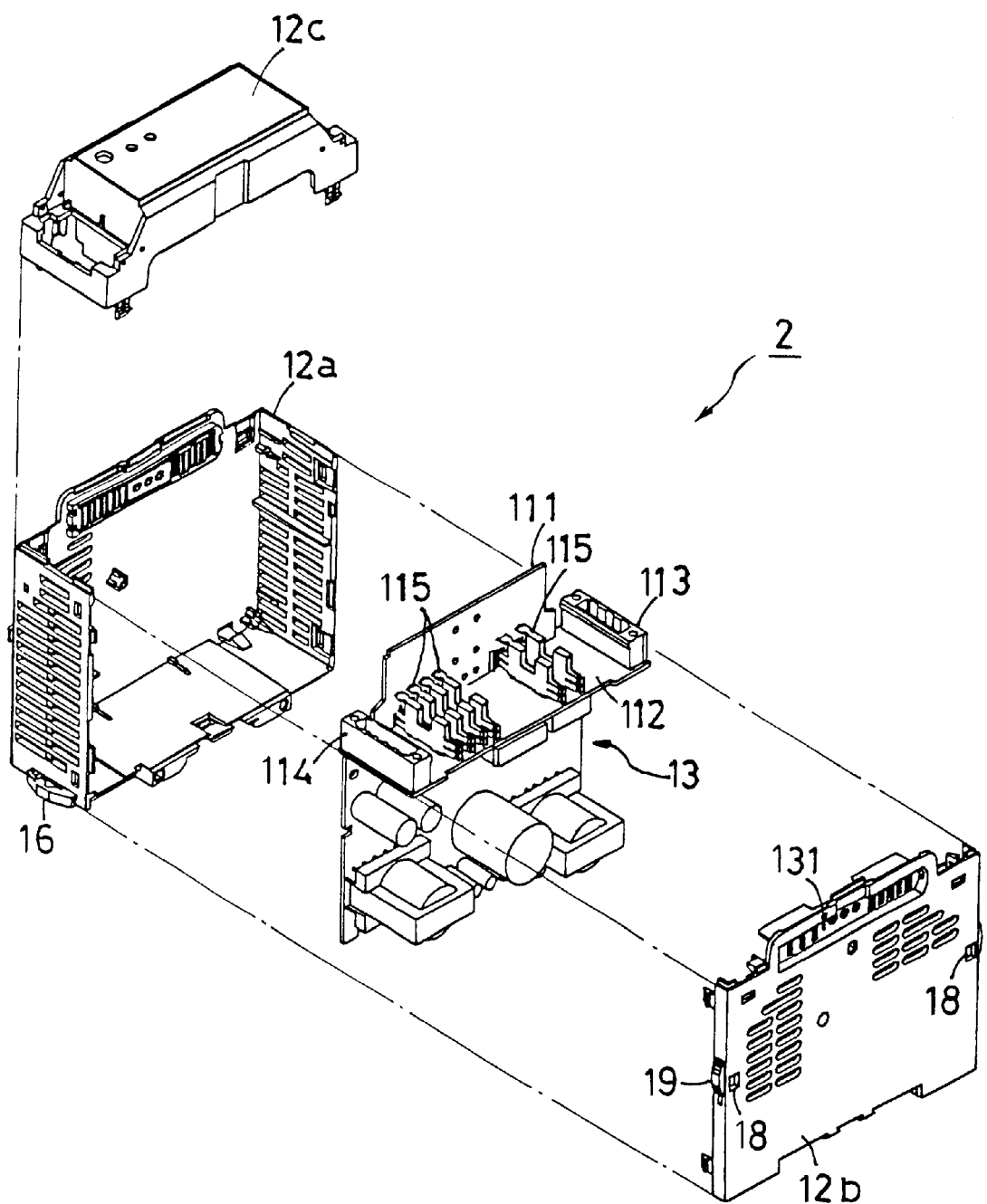
FIG. 21 is an exploded perspective view of a power supply unit of FIG. 18.
Figure 23:
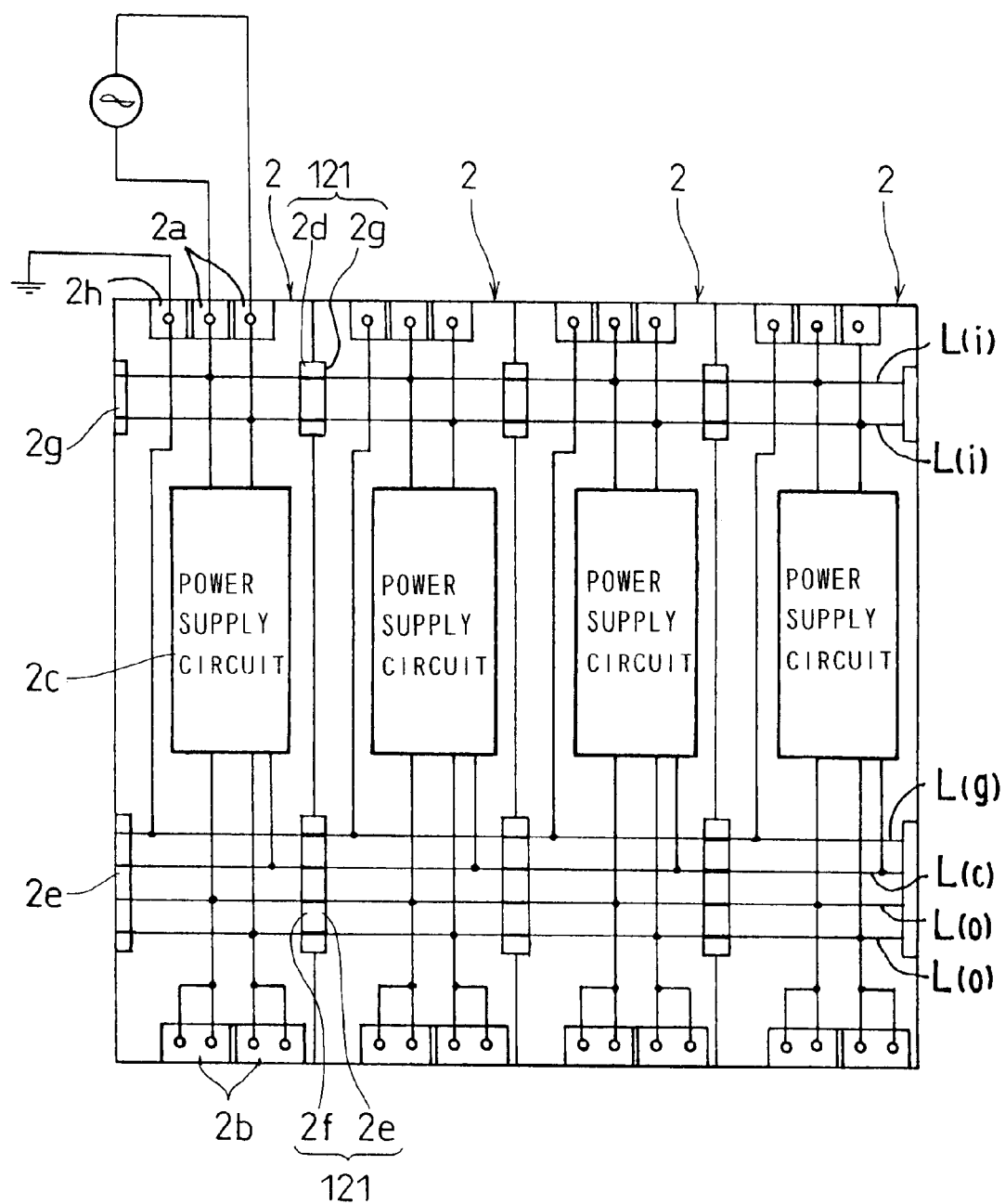
FIG. 23 is an electric circuit diagram of a power supply module according to a twelfth embodiment of the present invention.

A power supply module according to an eleventh embodiment of the present invention will now be described by referring to FIGS. 18 to 22. FIG. 18 shows an internal circuit of the power supply unit 2. In the same way as the above described tenth embodiment, the power supply module according to the eleventh embodiment is formed of power supply units 2 all having the same configuration. On an upper part of the casing, one pair of AC input terminals 2a and a ground terminal 2h are juxtaposed. An AC input side connector 2g on a first side face of the casing includes one pair of connector terminals 2g1 and 2g1. An AC output side connector 2d on a second side face of the casing includes one pair of connector terminals 2d1 and 2d1.

A DC input side connector 2e on the first side face of the casing includes a ground connector terminal 2e1, a communication connector terminal 2e2, and one pair of DC input connector terminals 2e3 and 2e3. A DC output side connector 2f1 on the second side face of the casing includes a ground connector terminal 2f1, a communication connector terminal 2f2, and one pair of DC output connector terminals 2f3 and 2f3.

On a lower part of the casing, two pairs of DC output terminals 2b are provided.

A configuration of the power supply unit 2 will now be described by referring to FIGS. 19 to 22.

In the master power supply unit 2, a numeral 12 denotes the casing.

The casing 12 includes a main case 12a, side cases 12b, and a front case 12c. In the casing 12, circuit parts 13 for a power supply circuit 2c are incorporated.

The back face of the casing 12 has an attachment groove 15 formed in the horizontal direction. An attachment piece 16 is attached to the casing 12 so as to be slidable in the vertical direction with respect to the attachment groove 15. In such a state that the DIN rail 1 is engaged with the attachment groove 15, the attachment piece 16 is slid toward the attachment groove 15 and engaged with a bottom edge of the DIN rail 1. As a result, the power supply unit 2 is attached to the DIN rail 1.

The casing 12 includes hooks 17 for mechanically coupling adjacent power supply units 2 and engagement holes 18 for inserting the hooks 12 therein, on upper and lower parts of side faces.

In such a state that the hooks 17 of an adjacent power supply unit 2 are inserted in the engagement holes 18, slip out of the hooks 17 is prevented by conducting slide operation on lock knobs 19 mounted on the casing 12.

Inside the casing 12, a main circuit board 111 and a front circuit board 112 coupled to the main circuit board 111 at right angles are incorporated.

On the main circuit board 111, main electronic parts for AC-DC conversion are mounted. Besides electronic parts such as a monitor lamp and an output voltage adjustment variable resistor, an input side connector 113 for forming one pair of AC input terminals 2a and the ground terminal 2h, an output side connector 114 for forming the two pairs of DC output terminals 2b, and six connection metal fittings 115 are mounted on the front circuit board 112.

Each connection metal fitting 115 is obtained by stamping out a conductive metal plate having a spring property and conducting press forming on it to form a U shape having one pair of bent piece portions opposed to each other.

The connection metal fitting 115 includes a connection pin 115a, pairs of connection pins 115b, and pairs of elastic contact segments 115c and 115d.

The connection pin 115a is inserted in the main circuit board 111, soldered, and coupled. The pairs of connection pins 115b are inserted in the front circuit board 112, soldered, and coupled. The pairs of elastic contact segments 115c and 115d are extended in a cantilever form and are opposed to each other.

Two upper connection metal fittings 115 form a pair of connection lines L(i) for connection between the AC input side connector 2g and the AC output side connector 2d.

The elastic contact segments 115c and 115c located on both end sides of first sides of both connection metal fittings 115 form one pair and function as connector terminals 2g1 and 2g1 of the AC input side connector 2g. The elastic contact segments 115d and 115d located on second sides of both connection metal fittings 115 form one pair and function as connector terminals 2d1 and 2d1 of the AC output side connector 2d.

Four lower connection metal fittings 115 respectively form connection lines L (g), L (c), L (o) and L(o) for connection between the DC input side connector 2e and the DC output side connector 2f.

The elastic contact segments 115c located on first sides of respective connection metal fittings 115 function as connector terminals of the DC input side connector 2e. The elastic contact segments 115d located on second sides of respective connection metal fittings 115 function as connector terminals of the DC output side connector 2f.

The power supply unit 2 formed as heretofore described can be utilized singly as well. Alternatively, it is also possible to designate one power supply unit as a master power supply unit, add an arbitrary number of power supply units 2 as expansion power supply units for extension in parallel thereto, and form a power supply module having a desired power supply capacity.

A power supply module according to a twelfth embodiment of the present invention will now be described by referring to FIGS. 23 to 29.

Figure 24:
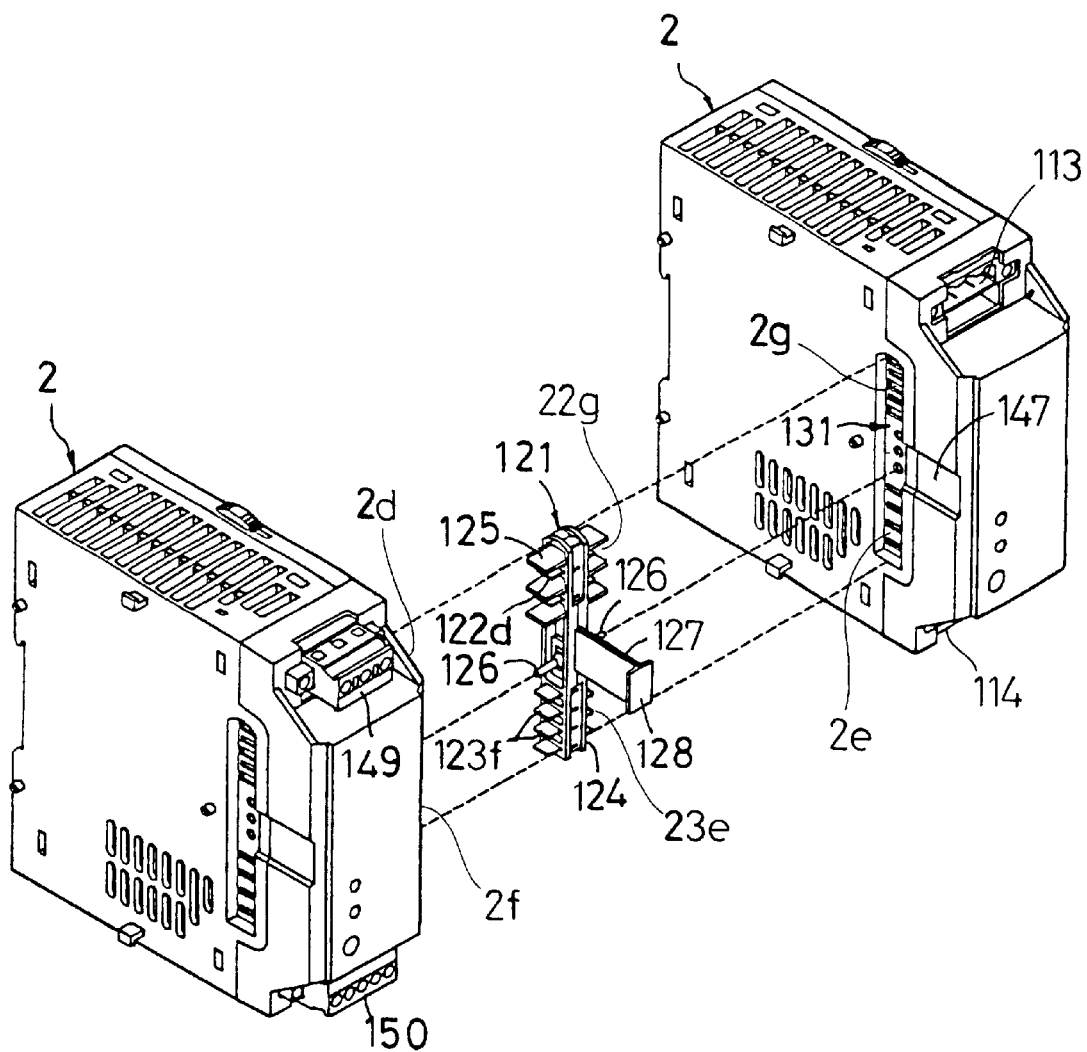
FIG. 24 is a perspective view of a pair of power supply units and a connector used for connection between them in a power supply module of FIG. 23.
Figure 26A:
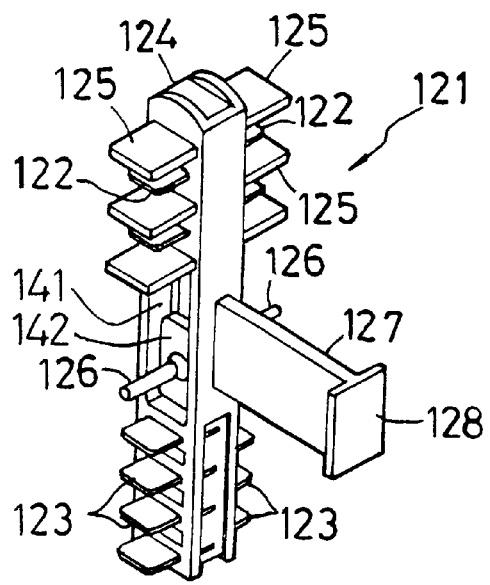
FIG. 26A is an enlarged perspective view of a connector shown in FIG. 24 seen from one side.
Figure 26B:
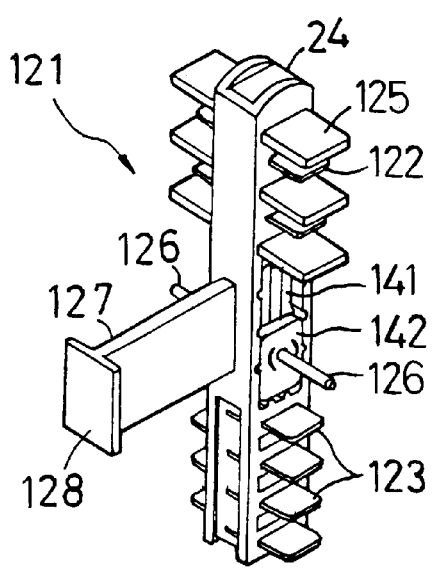
FIG. 26B is an enlarged perspective view of a connector shown in FIG. 26A seen from the other side.
Figure 26C:
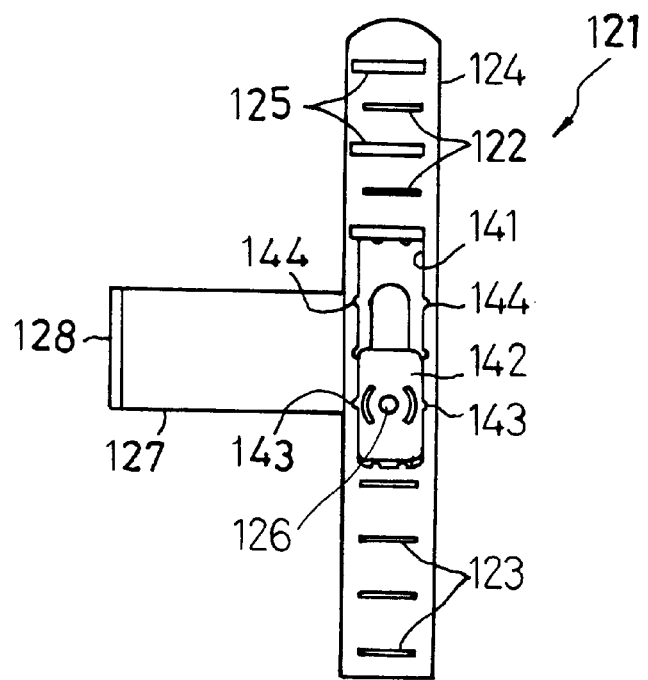
FIG. 26C is a front view of a connector shown in FIG. 26A.
Figure 27:
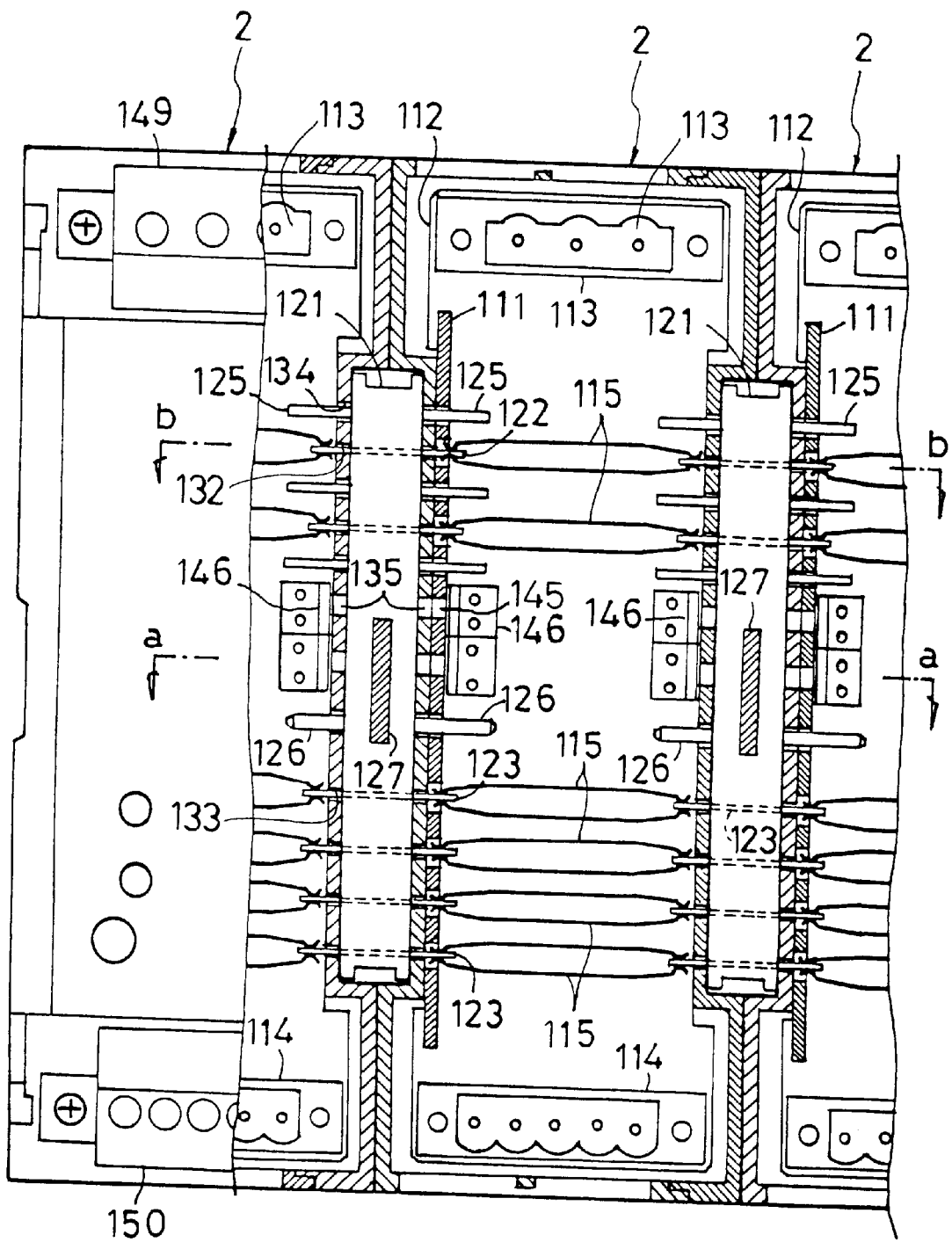
FIG. 27 is an enlarged front view of a power supply module of FIG. 23 with a part thereof being sectioned longitudinally.
Figure 28:
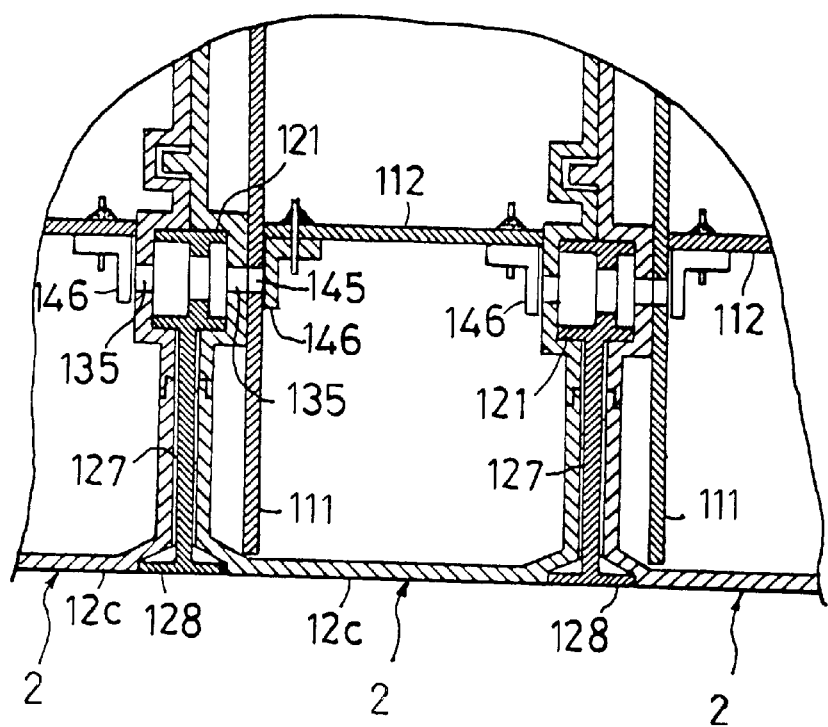
FIG. 28 is a sectional view taken along a line a—a of FIG. 27.
Figure 29:
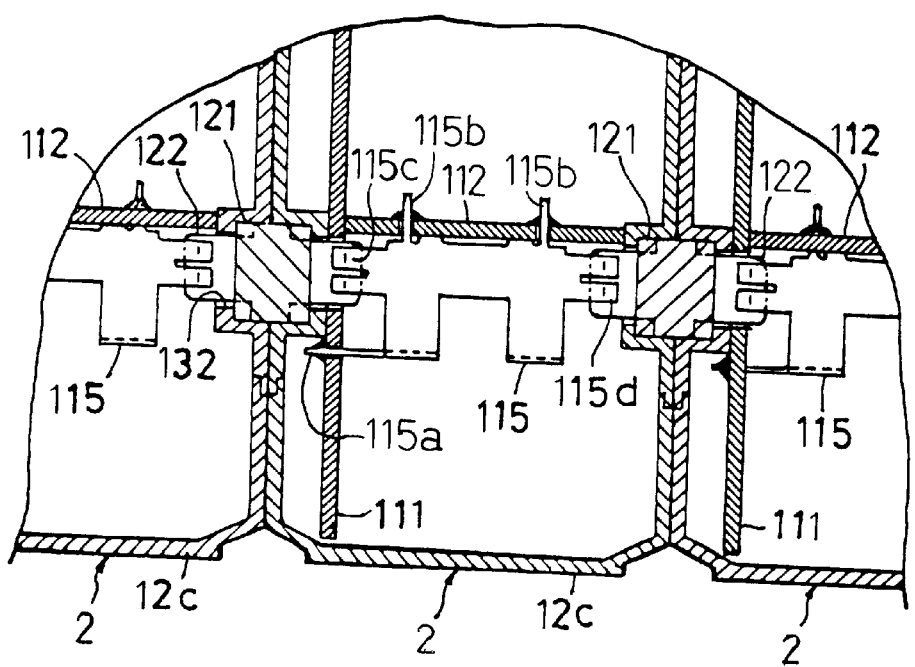
FIG. 29 is a sectional view taken along a line b—b of FIG. 27.

In the power supply module as described above, an intermediate connector 121 shown in FIG. 24 is utilized for electrical connection between the power supply units 2 in order to reduce the size of the power supply units in the direction of connection on the DIN rail 1 and prevent false connection between power supply units of different specifications.

This intermediate connector 121 includes a connector main body 124 made of resin. The connector main body 124 has two, i.e., upper and lower connection terminals 122 made of metal, which penetrate the upper portion side thereof. Both connection terminals 122 project in the direction of the AC output side connector 2d and in the direction of the AC input side connector 2g of two adjacent power supply units 2 and 2.

The connector main body 124 further includes four connection terminals 123 made of metal and arranged in four lines in the vertical direction, which penetrate the lower portion side thereof. In the same way, the connection terminals 123 project in the direction of the DC output side connector 2f and in the direction of the DC input side connector 2e of two adjacent power supply units 2 and 2.

From the connector main body 124, guard projections 125 are projected above the connection terminals 122 as one body. From an intermediate location of the connector main body 124 in the vertical direction, restraint pins 126 are projected as one body.

From an intermediate location of the front face of the connector main body 124 in the vertical direction, a leg portion 127 is projected forward. On a front end of the leg portion 127, an indication portion 128, which is flat against the front.

On the other hand, on each of the left and right side faces of the casing 12 of each power supply unit 2, a connector coupling portion 131 having such a depth that the intermediate connector 121 gets therein is formed. This connector coupling portion 131 includes two terminal insertion holes 132 for inserting the two connection terminals 122 therein, four terminal insertion holes 133 for inserting the four connection terminals 123 therein, three guide holes 134 for inserting three guard projections 125 therein, and three pin insertion holes 135 for one restraint pin 126.

The connector coupling portion 131, the terminal insertion holes 132 and 133, the guide hole 134, and the pin insertion holes 135 form the connectors 2d to 2g of the power supply units 2.

In the casing 12, the elastic contact segments 115c and 115d of the connection metal fittings 115 face to the terminal insertion holes 132 and 133. When the intermediate connector 121 is attached to the connector coupling portion 131, the connection terminals 122 and 123 are inserted into the corresponding elastic contact segments 115c and 115d and sandwiched in between them.

In the casing 12, the main circuit board 111 is located at the back of the left side connector coupling portion 131. The left side elastic contact segments 115c face to the terminal insertion holes 132 and 133 of the connector coupling portion 31 through openings 136 formed through the main circuit board 111.

Here, the restraint pin 126 allows only connection between power supply units 2 having the same output voltage, and prevents connection between power supply units 2 which are different in output voltage.

By selecting the position of the restraint pin 126 with respect to the pin insertion holes 135, this power supply module can cope with a plurality of kinds of power supply specifications.

In other words, the restraint pin 126 is projected from a movable piece 142, which is captured in a guide groove formed on the connector main body 124 so as to be able to slide in the vertical direction with respect to the guide groove 141. If the restraint pin 126 is moved in the vertical direction, then the movable piece 42 is slid in the vertical direction with respect to the guide groove 141. As a result, a small projection 143 is engaged in one of positioning indents 144 formed in three vertical locations of the guide groove 141. Accordingly, the restraint pin 126 is held in that position.

On the other hand, three pin insertion holes 135 are formed so as to correspond to the movement positions of the restraint pin 126. In the main circuit board 17 as well, three pin insertion holes 145 are formed so as to be opposed to the pin insertion holes of the connector coupling portion 131 of the left side.

Blocking members 146 are attached to left and right portions of the front circuit board 112. The blocking members 146 block two among three pin insertion holes 145 of the main circuit board 111 and two among three pin insertion holes 135 of the left side connector coupling portion 131. Pin insertion holes 145 and 135 of one location having the same height position as that of the restraint pin 126 are opened.

In the above described example, only the lowest pin insertion holes 145 and 135 are opened so as to correspond to the restraint pin 126 set in the lowest location. As a result of the configuration heretofore described, extension of power supply units 2 having the same specifications is made possible by the restraint pin 126.

On the left and right side faces of each power supply unit 2, a shallow groove 147 communicating with each connector coupling portion 31 is formed. The leg portion of the intermediate connectors 121 is passed forward between the left and right adjacent power supply units 2 through the shallow grooves 147. As a result, the indication portion 128 is exposed to the front. Thus, easy visual confirmation as to whether the intermediate connector 121 is attached properly becomes possible.

Among a plurality of power supply units coupled as described above, a power supply unit 2 located in the left end becomes the master power supply unit. On the upper portion of the front face of this power supply unit 2, an input terminal base 149 screwed to the input side connector 113 is disposed. On the lower portion of the front face of each master power supply unit 2, an output terminal base 150 screwed to the output side connector 114 is disposed. Wiring connection to an AC power source and a load apparatus can thus be conducted.

A power supply module according to a thirteenth embodiment of the present invention will now be described by referring to FIG. 30. By connecting a communication unit 151 to a master power supply unit 2 located at the right end and connecting a control signal line L(c) of the master power supply unit 2 to a microcomputer 152 incorporated in the communication unit 151, each master power supply unit 2 can be controlled according to the contents of communication with the outside.

Figure 31:
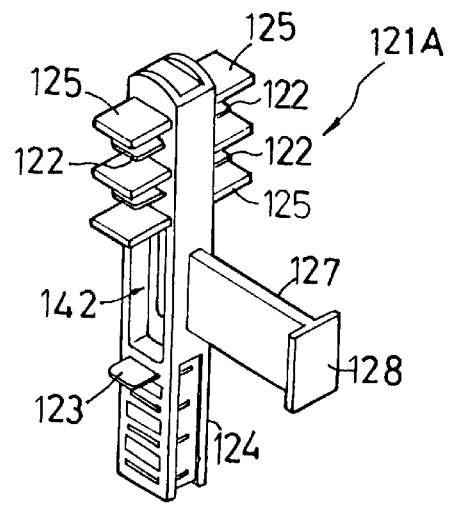
FIG. 31 is an enlarged perspective view of a connector used in a power supply module according to a fourteenth preferred embodiment of the present invention.
Figure 32:
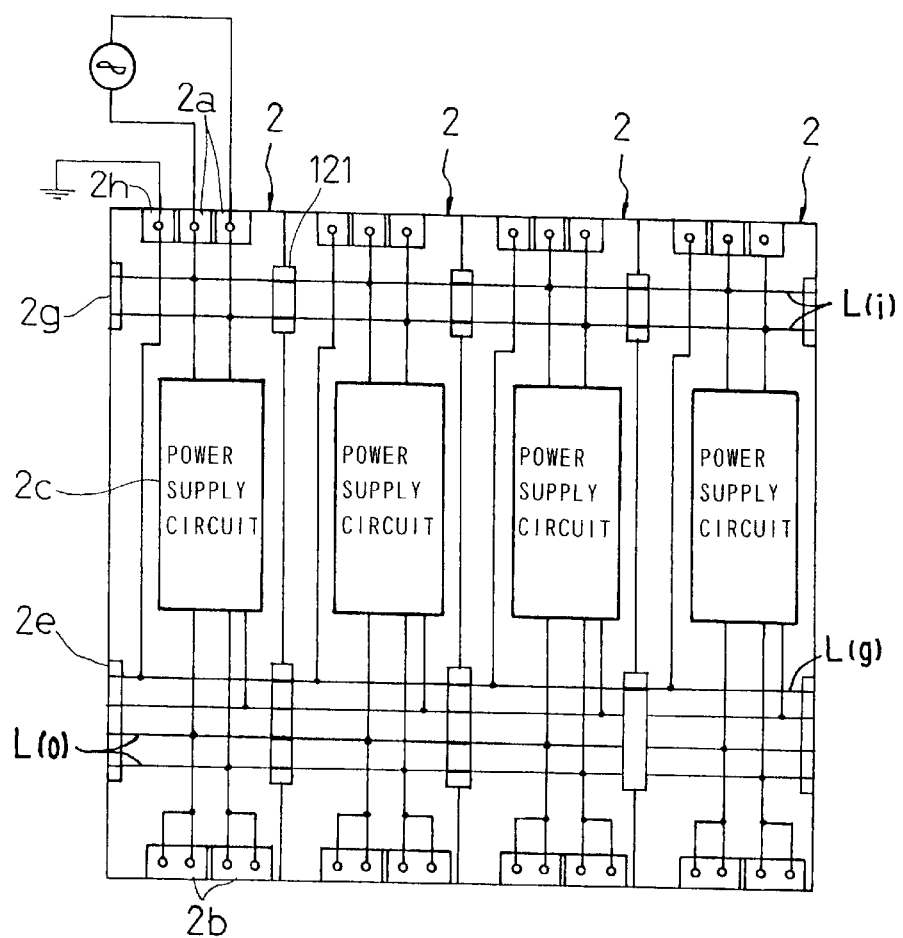
FIG. 32 is an electric circuit diagram of a power supply module according to a fourteenth preferred embodiment of the present invention.

A power supply module according to a fourteenth embodiment of the present invention will now be described by referring to FIGS. 31 and 32. From the intermediate connector 121A, the restraint pin 126 and the output connection terminals 123 are removed. By utilizing this intermediate connector 121A, it is also possible to connect master power supply units which are different in specifications (output voltage) in such a state that only the AC input is used in common.

In the case where the connection metal fittings 115 are utilized for connection of signal lines, the contact segments 115c and 115d provided on both ends of each of the connection metal fittings 115 may also be formed in a form of one tongue that deforms elastically, in a form of one tongue that does not deform elastically, or in a pin form.

Furthermore, on the indication portion 128 of the intermediate connector 121, an indication for discriminating from the above described intermediate connector 121 may be indicated.

As for the intermediate connector 121, it is also possible to prepare such a plurality of kinds of specifications that the restraint pin 126 is fixed in a predetermined position, and select and utilize an intermediate connector 121 of specifications corresponding to the master power supply unit 2.

Only one pin insertion hole 145 may be formed through the main circuit board 111 according to output specifications.

It is also possible to previously form a plurality of blanking dies for pin insertion holes on the connector coupling portion 131 and conduct punching to form a single pin insertion hole 135 in a predetermined position according to specifications of the power supply unit 2.

While there has been described what is at present considered to be preferred embodiments of this invention, it will be understood that various modifications may be made therein, and it is intended to cover in the appended claims all such modifications as fall within the true spirit and scope of this invention.

What is claimed is:

1. A power supply module comprising:
   a first power supply unit for converting an external AC voltage inputted thereto to a DC voltage, outputting the DC voltage, and supplying the external AC voltage to other power supply units; and
   one or a plurality of second power supply units for converting an external AC voltage inputted thereto to a DC voltage and outputting the DC voltage, said second power supply units being connected in parallel with said first power supply unit,
   wherein an arbitrary power supply capacity is obtained by setting a number of said second power supply units connected in parallel with said first power supply unit.

2. A power supply module according to claim 1, wherein
   both said first power supply unit and said second power supply units can be attached to an attachment rail, and
   when expanding a power supply capacity, said second power supply unit is attached to said attachment rail and connected in parallel with said first power supply unit.

3. A power supply module according to claim 1, wherein said first and second power supply units have an identical power supply capacity.

4. A power supply module according to claim 1, wherein said first power supply unit comprises:
   an AC input terminal for inputting an external AC voltage;
   a first power supply circuit for converting the external AC voltage supplied from said AC input terminal connected thereto to a DC voltage and outputting said DC voltage;
   a first DC output terminal for outputting the DC voltage supplied from said first power supply circuit connected thereto; and
   a first AC output side connector for outputting the external AC voltage supplied from said AC input terminal connected thereto, to outside, said first AC output side connector being provided on a parallel connection face for said second power supply units,
   said second power supply unit comprises:
   a second AC input side connector provided on a first parallel connection face for parallel connection with said first power supply unit, and connected to said first AC output side connector of said first power supply unit;
   a second power supply circuit for converting an external AC voltage supplied from said second AC input side connector to a DC voltage and outputting the DC voltage;
   a second DC output terminal for outputting the DC voltage supplied from said second power supply circuit connected thereto; and
   a second AC output side connector connected to said second AC input side connector and provided on a second parallel connection face for parallel connection with other adjacent power supply units.

5. A power supply module according to claim 4, wherein
   said first power supply unit comprises a first DC output side connector connected to said first power supply circuit on said parallel connection face, and
   said second power supply unit comprises:
   a second DC input side connector connected to said first DC output side connector of said first power supply unit on said first parallel connection face; and
   a second DC output side connector connected to said second DC input side connector on said second parallel connection face.

6. A power supply module according to claim 1, wherein each of said first and second power supply units comprises:
   an AC input terminal for inputting an external AC voltage;
   a power supply circuit for converting the external AC voltage supplied from said AC input terminal connected thereto to a DC voltage and outputting said DC voltage;
   a DC output terminal for outputting the DC voltage supplied from said power supply circuit connected thereto;
   an AC input side connector provided on a first parallel connection face for another power supply unit, and
   an AC output side connector for outputting the external AC voltage supplied from said AC input terminal to outside, said AC output side connector being connected to said AC input terminal and said AC input side connector and provided on a second parallel connection face for another power supply unit.

7. A power supply module according to claim 6, wherein each of said first and second power supply units comprises:
   a DC input side connector on said first parallel connection face;
   a DC output side connector connected to said DC input side connector and said power supply circuit on said second parallel connection face.

8. A power supply module according to claim 7, wherein
   each of said first and second power supply units comprises a communication line, and
   said communication line is connected between said DC input side connector and said DC output side connector.

9. A power supply module according to claim 1, wherein said first power supply unit comprises:
   an aluminum electrolytic capacitor for power supply generation in a power supply circuit thereof, and
   a life prediction circuit for conducting life prediction of said aluminum electrolytic capacitor based on capacitance degradation thereof.

10. A power supply module according to claim 1, wherein said first power supply unit comprises a microcomputer for conducting power supply control according to contents of communication conducted with outside.

11. A power supply module according to claim 1, comprising a communication unit for conducting communication concerning power supply control between said power supply units and outside, said communication unit being connected in parallel with said power supply units.

12. A power supply module according to claim 1, comprising a branch unit for allowing branch operation according to a load state, said branch unit being connected in parallel with said power supply units.

13. A power supply module according to claim 1, comprising a battery mounting power supply unit for making it possible to supply power to a load as occasion demands, said battery mounting power supply unit being connected in parallel with said power supply units.

14. A power supply module according to claim 1, comprising a battery mounting power supply unit for making possible operation for a peak load, said battery mounting power supply unit being connected in parallel with said power supply units.

15. A power supply unit comprising:
    an AC input terminal for inputting an external AC voltage;
    a power supply circuit for converting the external AC voltage supplied from said AC input terminal connected thereto to a DC voltage and outputting said DC voltage;
    a DC output terminal for outputting the DC output supplied from said power supply circuit connected thereto; and
    an AC output side connector connected to said AC input terminal and provided on a first parallel connection face, said AC output side connector being capable of being connected to an AC input side connector of another power supply unit.

16. A power supply unit according to claim 15, comprising a DC output side connector connected to said power supply circuit and provided on the first parallel connection face, said DC output side connector being capable of being connected to an DC input side connector of another power supply unit.

17. A power supply unit according to claim 15, comprising a microcomputer for conducting communication concerning power supply with outside, said microcomputer being connected to said power supply circuit.

18. A power supply unit according to claim 15, comprising a communication line for conducting communication with a communication unit.

19. A power supply unit comprising:
    an AC input terminal for inputting an external AC voltage;
    a power supply circuit for converting the external AC voltage supplied from said AC input terminal to a DC voltage and outputting said DC voltage;
    a DC output terminal for outputting the DC output supplied from said power supply circuit to outside;
    an AC input side connector for inputting an external AC voltage supplied from another power supply unit, said AC input side connector being provided on a first parallel connection face for parallel connection with another power supply unit; and
    an AC output side connector for outputting the external AC voltage to another power supply unit, said AC output side connector being connected to said AC input terminal and said AC input side connector, and provided on a second parallel connection face for parallel connection with another power supply unit.

20. A power supply unit comprising:
    an AC input terminal for inputting an external AC voltage;
    a power supply circuit for converting the external AC voltage supplied from said AC input terminal to a DC voltage and outputting said DC voltage;
    a DC output terminal for outputting the DC output supplied from said power supply circuit to outside;
    an AC input side connector for inputting an external AC voltage supplied from another power supply unit connected in parallel, said AC input side connector being provided on a first parallel connection face for parallel connection with another power supply unit;
    an AC output side connector for supplying the external AC voltage supplied from said AC input terminal or said AC input side connector to another power supply unit connected on second parallel connection face, said AC output side connector being connected to said AC input terminal and said AC input side connector, and provided on said second parallel connection face for parallel connection with another power supply unit;
    a DC input side connector for inputting a DC voltage supplied from another power supply unit connected in parallel on said first parallel connection face or a DC voltage supplied from said power supply circuit; and
    a DC output side connector for outputting a DC output supplied from said power supply circuit or said DC input side connector to another power supply unit connected in parallel on said second parallel connection face, said DC output side connector being connected to said power supply circuit and said DC input side connector.

21. A power supply unit according to claim 20, comprising a communication line between said DC input side connector and said DC output side connector.

22. A power supply unit according to claim 20, wherein said power supply unit comprises:
    a casing having an attachment groove for engaging with an attachment rail, on a rear face thereof;
    one or a plurality of circuit boards disposed in said casing; and
    an input side connector, an output side connector, and a plurality of connection metal fittings provided on said circuit boards,
    electronic parts forming a power supply circuit are mounted on at least one of said circuit boards,
    said input side connector forms said AC input terminal,
    said output side connector forms said DC output terminal, and
    said plurality of connection metal fittings form a connection line between said AC input side connector and said AC output side connector and a connection line between said DC input side connector and said DC output side connector, and both ends of said plurality of connection metal fittings extend between said first parallel connection face and said second parallel connection face in said casing and form connector terminals respectively of said AC input side connector, said AC output side connector, said DC input side connector, and said DC output side connector.

23. A power supply module, comprising:
    a plurality of power supply units; and
    an intermediate connector for connecting said power supply units in parallel,
    wherein each of said power supply unit comprises:
        a casing having an attachment groove for engaging with an attachment rail, on a rear face thereof;
        one or a plurality of circuit boards disposed in said casing; and
        an input side connector, an output side connector, and a plurality of connection metal fittings provided on said circuit boards,
        electronic parts forming a power supply circuit are mounted on at least one of said circuit boards,
        said input side connector forms said AC input terminal,
        said output side connector forms said DC output terminal,
        said plurality of connection metal fittings form a connection line between said AC input side connector and said AC output side connector and a connection line between said DC input side connector and said DC output side connector, and both ends of said plurality of connection metal fittings extend between said first parallel connection face and said second parallel connection face in said casing and form connector terminals respectively of said AC input side connector, said AC output side connector, said DC input side connector, and said DC output side connector, on each of said first and second parallel connection faces in said casing, a restraint pin insertion hole is provided and terminal insertion holes are provided in locations that both ends of said connection metal fittings face to, and said intermediate connector comprises connection terminals which are inserted in terminal insertion holes of two adjacent power supply units attached to said attachment rail and connected to connector terminals formed by connection metal fittings, and a restraint pin which is inserted in said restraint pin insertion hole.

24. A power supply module according to claim 23, wherein on each of said first and second parallel connection faces in said casing, a plurality of restraint pin insertion holes are provided, said restraint pin of said intermediate connector can be selectively moved to any of said restraint pin insertion holes.

25. A power supply module according to claim 23, wherein said intermediate connector comprises an indication portion for indicating a connection state of said power supply units.

* * * * *